(12) United States Patent
Iwabuchi

(10) Patent No.: US 8,196,619 B2
(45) Date of Patent: Jun. 12, 2012

(54) LOAD LOCK APPARATUS, PROCESSING SYSTEM AND SUBSTRATE PROCESSING METHOD

(75) Inventor: Katsuhiko Iwabuchi, Tsukui-gun (JP)

(73) Assignee: Tokyo Electron Limited, Tokyo (JP)

( * ) Notice: Subject to any disclaimer, the term of this patent is extended or adjusted under 35 U.S.C. 154(b) by 62 days.

(21) Appl. No.: 12/605,216

(22) Filed: Oct. 23, 2009

(65) Prior Publication Data

US 2010/0040437 A1 Feb. 18, 2010

Related U.S. Application Data

(62) Division of application No. 11/404,086, filed on Apr. 14, 2006, now Pat. No. 7,624,772.

(30) Foreign Application Priority Data

Apr. 18, 2005 (JP) .................................. 2005-119733

(51) Int. Cl.
*B65B 1/20* (2006.01)
(52) U.S. Cl. ......................................... 141/82; 118/725
(58) Field of Classification Search .................... 141/11, 141/98, 69, 82, 89; 118/719, 724, 725; 156/345.32, 156/345.31
See application file for complete search history.

(56) References Cited

U.S. PATENT DOCUMENTS

| | | | |
|---|---|---|---|
| 1,615,878 A | 2/1927 | Laird | |
| 4,169,911 A | 10/1979 | Yoshida et al. | |
| 4,307,753 A | 12/1981 | Dryer | |
| 4,693,777 A * | 9/1987 | Hazano et al. | ........... 156/345.31 |
| 4,734,998 A | 4/1988 | Lee et al. | |
| 4,870,923 A | 10/1989 | Sugimoto | |
| 4,990,047 A | 2/1991 | Wagner et al. | |
| 5,007,590 A | 4/1991 | Taylor | |
| 5,617,963 A | 4/1997 | Baziuk et al. | |
| 6,435,868 B2 | 8/2002 | White et al. | |
| 7,207,766 B2 | 4/2007 | Kurita et al. | |
| 2002/0195202 A1 | 12/2002 | Arita et al. | |
| 2003/0047282 A1 | 3/2003 | Sago et al. | |
| 2003/0061938 A1 | 4/2003 | Kunstadt et al. | |
| 2006/0112880 A1 | 6/2006 | Iwabuchi et al. | |

FOREIGN PATENT DOCUMENTS

| | | |
|---|---|---|
| CN | 1407135 A | 4/2003 |
| CN | 1419661 A | 5/2003 |
| CN | 1461970 A | 12/2003 |
| CN | 1520604 A | 8/2004 |
| JP | 9-249471 | 9/1997 |
| JP | 11-307513 | 11/1999 |
| JP | 2001-319885 | 11/2001 |
| JP | 2002-158273 | 5/2002 |

(Continued)

*Primary Examiner* — Gregory Huson
*Assistant Examiner* — Jason Niesz
(74) *Attorney, Agent, or Firm* — Oblon, Spivak, McClelland, Maier & Neustadt, L.L.P.

(57) ABSTRACT

A load lock apparatus including a carry port provided on a side of a carry-in/out section for carrying a substrate in/out from/to the outside, and a carry port provided on a side of a processing section for processing the substrate, includes: a temperature controlling plate for controlling a temperature of the substrate, the temperature controlling plate configured including a plate body made of a porous material and a temperature controlling gas supply path for supplying a temperature controlling gas controlled in temperature to the plate body. The temperature controlling gas passes through the plate body, blows out from a surface of the plate body, and is supplied to the substrate.

18 Claims, 11 Drawing Sheets

FOREIGN PATENT DOCUMENTS

| | | |
|---|---|---|
| JP | 2002-222849 | 8/2002 |
| JP | 2002222799 A | 8/2002 |
| JP | 2003-13215 | 1/2003 |
| JP | 2003-231970 | 8/2003 |
| JP | 2003-343982 | 12/2003 |
| JP | 2004-221197 | 8/2004 |
| JP | 2004-523880 | 8/2004 |
| JP | 2005-72525 | 3/2005 |
| WO | WO 01/63361 A1 | 8/2001 |
| WO | WO 02/23597 A2 | 3/2002 |

\* cited by examiner

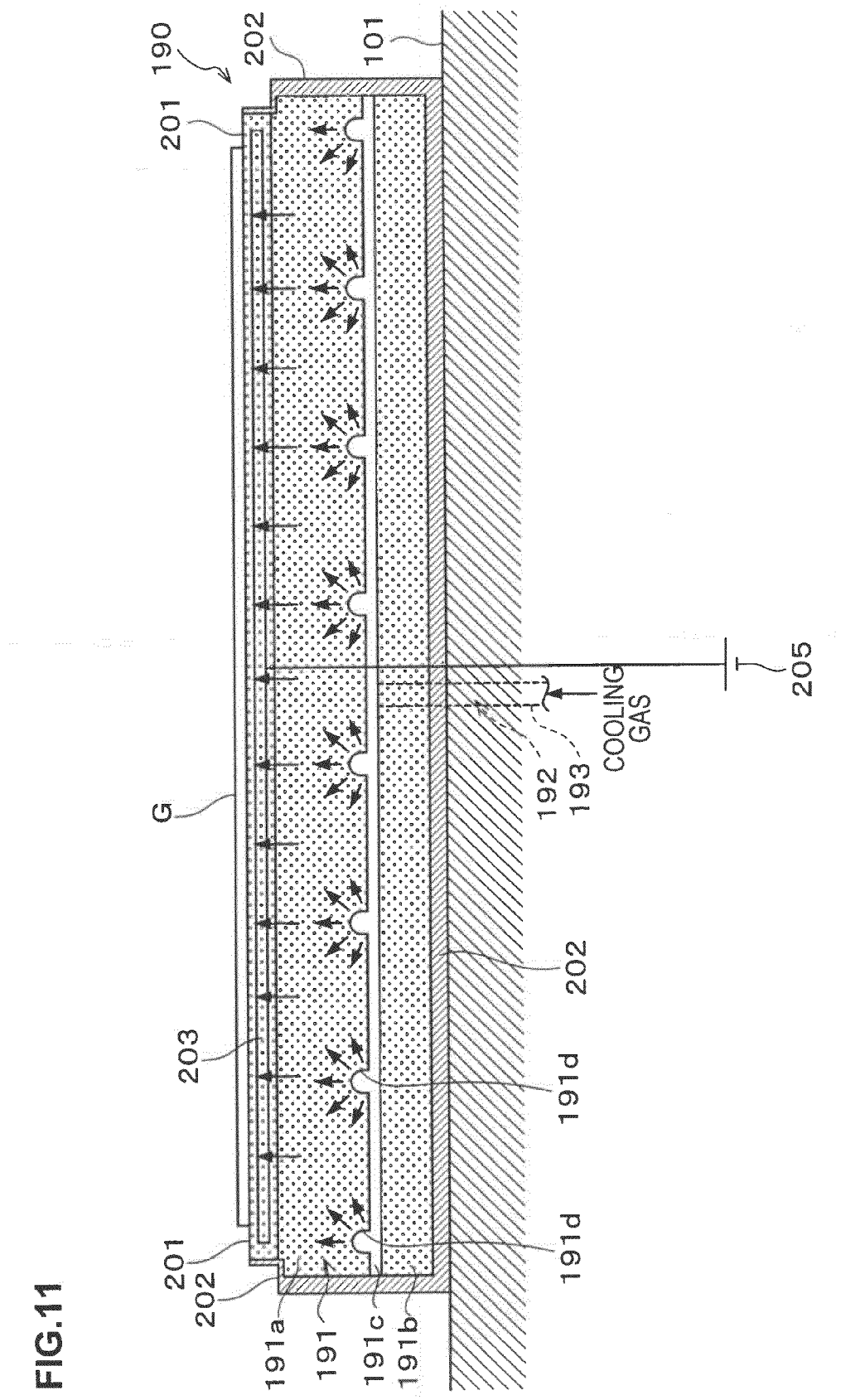

LOAD LOCK APPARATUS, PROCESSING SYSTEM AND SUBSTRATE PROCESSING METHOD

CROSS REFERENCE

This application is a Divisional of and claims the benefit of priority under 35 U.S.C. §120 from U.S. Ser. No. 11/404,086, the entire contents of which are incorporated herein by reference, filed Apr. 14, 2006 and claims the benefit of priority under 35 U.S.C. §119 from Japanese Patent Application No. JP 2005-119733 filed Apr. 18, 2005.

BACKGROUND OF THE INVENTION

1. Field of the Invention

The present invention relates to a processing system and a processing method each for processing a substrate, and a load lock apparatus used therein.

2. Description of the Related Art

In a manufacturing process of, for example, an LCD substrate or the like, a so-called multi-chamber type processing system is used which includes a plurality of substrate processing apparatuses for performing predetermined processing for the substrate in a reduced-pressure atmosphere, such as etching, ashing, and so on (see Japanese Translated National Publication of Patent Application No. 2004-523880). Such a processing system includes a carrier room including a substrate carrier unit for carrying the substrate and a processing section having a plurality of substrate processing apparatuses provided around the carrier room. The substrate is carried into/out of each of the substrate processing apparatuses by a carrier arm of the substrate carrier unit. The processing system includes a carry-in/out section for carrying a substrate in/out from/to the outside and a load lock apparatus provided between the carry-in/out section and the processing section. The substrate carried into the carry-in/out section is carried into the processing section via the load lock apparatus, and processed in the processing section, and then carried out to the carry-in/out section again via the load lock apparatus.

As the load lock apparatus, there is known one which includes a heating plate for pre-heating the substrate in the load lock apparatus (see Japanese Patent Application Laid-open No. 2001-239144-2). Further, a load lock apparatus is proposed which includes a heating plate and a cooling plate, so that when the substrate is carried from the carry-in/out section into the processing section, the substrate can be heated by the heating plate, and when the substrate is carried out of the processing section into the carry-in/out section, the substrate can be cooled by the cooling plate (see Japanese Translated National Publication of Patent Application No. 2004-523880).

It is conceivable to configure the heating plate for use in the load lock apparatus or the like such that, for example, a plate body made of metal such as a stainless alloy, an aluminum (Al) alloy or the like incorporates a heating element such as a sheathed heater or the like so that the heating element conducts heat to the plate body, and the heat emitted from the heated plate body heats the substrate. It is conceivable to configure the cooling plate such that, for example, a plate body made of metal such as a stainless alloy, an aluminum alloy or the like incorporates a cooling water conveyance pipe for passing a cooling water therethrough so that the cooling water cools the plate body, and the cold heat of the cooled plate body cools the substrate. Further, a method is also proposed which supplies an inert gas such as nitrogen ($N_2$), helium (He) or the like to the substrate to cool the substrate (see Japanese Translated National Publication of Patent Application No. 2004-523880).

SUMMARY OF THE INVENTION

However, when the plate body of the heating plate is made of a stainless alloy, the stainless alloy has poor thermal conductivity and difficulties in uniformly heating the plate body, which may cause uneven heating in the substrate. Consequently, the thermal stress may cause deformation of the substrate and unevenness in substrate processing performed in the processing section. In addition, metal contamination may adhere to the substrate. Further, when the plate body of the heating plate is made of an aluminum alloy, the plate body has a problem of insufficient heat-resistance to high temperatures which allows the substrate to be heated only up to about 400° C. at maximum. There is another problem of poor efficiency of heating only by radiation heat.

On the other hand, when the plate body of the cooling plate is made of a stainless alloy, the stainless alloy has poor thermal conductivity and difficulties in uniformly cooling the plate body, which may also cause uneven cooling in the substrate. Consequently, the thermal stress may cause deformation of the substrate. Further, when gas is supplied to the substrate to cool the substrate, it is difficult to uniformly supply the gas to the substrate, which may cause uneven cooling in the substrate.

It is an object of the present invention to make it possible to preferably control the temperature of the substrate in a processing system for processing the substrate.

To solve the above problem, the present invention is a load lock apparatus including a carry port provided on a side of a carry-in/out section for carrying a substrate in/out from/to the outside, and a carry port provided on a side of a processing section for processing the substrate, including: a temperature controlling plate for controlling a temperature of the substrate carried in the load lock apparatus, the temperature controlling plate including a plate body made of a porous material and a temperature controlling gas supply path for supplying a temperature controlling gas controlled in temperature to the plate body, wherein the temperature controlling gas passes through the plate body, blows out from a surface of the plate body, and is supplied to the substrate.

Further, the present invention is a load lock apparatus including a carry port provided on a side of a carry-in/out section for carrying a substrate in/out from/to the outside, and a carry port provided on a side of a processing section for processing the substrate, including: a temperature controlling plate for controlling a temperature of the substrate carried in the load lock apparatus, the temperature controlling plate including a plate body made of a porous material, a temperature controller provided in the plate body, and a gas supply path for supplying a gas to the plate body, wherein the gas is controlled in temperature when passing through the plate body temperature-controlled by the temperature controller, blows out from a surface of the plate body, and is supplied to the substrate.

According to these load lock apparatuses of the present invention, the temperature controlling gas can be uniformly supplied from the plate body to the substrate. This can uniformly temperature-control the substrate.

In these load lock apparatuses, the porous material is, for example, porous carbon. The porous carbon has excellent thermal conductivity and thus can efficiently temperature-control the substrate. Further, the porous carbon has high heat-resistance even at high temperatures so that the substrate can be heated to high temperatures.

Further, in these load lock apparatuses, the surface of the plate body may be provided with a permeable protection film.

Further, in these load lock apparatuses, the temperature controlling plate may be capable of being relatively brought close to or away from the substrate.

Further, in these load lock apparatuses, the temperature controlling plate may be provided with an electrostatic attraction electrode for electrostatically attracting the substrate.

Further, these load lock apparatuses may further include: a second temperature controlling plate, wherein one of the temperature controlling plate and the second temperature controlling plate may be placed on a front surface side of the substrate and another may be placed on a rear surface side of the substrate. This arrangement can heat the substrate more efficiently and uniformly.

Further, the present invention is a substrate processing system including a processing section for processing a substrate; a carry-in/out section for carrying the substrate in/out; and a load lock section provided between the processing section and the carry-in/out section, wherein the load lock section includes a first load lock apparatus including a carry port provided on a side of the carry-in/out section for carrying the substrate in/out from/to the outside, and a carry port provided on a side of the processing section for processing the substrate; and a second load lock apparatus including a carry port provided on a side of the carry-in/out section for carrying the substrate in/out from/to the outside, and a carry port provided on a side of the processing section for processing the substrate, each of the first load lock apparatus and the second load lock apparatus including a temperature controlling plate for controlling a temperature of the substrate carried in the load lock apparatus, each of the temperature controlling plates of the first load lock apparatus and the second load lock apparatus including a plate body made of a porous material and a temperature controlling gas supply path for supplying a temperature controlling gas controlled in temperature to the plate body, wherein the temperature controlling gas passes through the plate body, blows out from a surface of the plate body, and is supplied to the substrate.

Further, the present invention is a substrate processing system including a processing section for processing a substrate; a carry-in/out section for carrying the substrate in/out; and a load lock section provided between the processing section and the carry-in/out section, wherein the load lock section includes a first load lock apparatus including a carry port provided on a side of the carry-in/out section for carrying the substrate in/out from/to the outside, and a carry port provided on a side of the processing section for processing the substrate; and a second load lock apparatus including a carry port provided on a side of the carry-in/out section for carrying the substrate in/out from/to the outside, and a carry port provided on a side of the processing section for processing the substrate, each of the first load lock apparatus and the second load lock apparatus including a temperature controlling plate for controlling a temperature of the substrate carried in the load lock apparatus, the temperature controlling plate of the first load lock apparatus including a plate body made of a porous material and a temperature controlling gas supply path for supplying a temperature controlling gas controlled in temperature to the plate body, wherein the temperature controlling gas passes through the plate body, blows out from a surface of the plate body, and is supplied to the substrate, the temperature controlling plate of the second load lock apparatus including a plate body made of a porous material, a temperature controller provided in the plate body, and a gas supply path for supplying a gas to the plate body, wherein the gas is controlled in temperature when passing through the plate body temperature-controlled by the temperature controller, blows out from a surface of the plate body, and is supplied to the substrate.

Further, the present invention is a substrate processing system including a processing section for processing a substrate; a carry-in/out section for carrying the substrate in/out; and a load lock section provided between the processing section and the carry-in/out section, wherein the load lock section includes a first load lock apparatus including a carry port provided on a side of the carry-in/out section for carrying the substrate in/out from/to the outside, and a carry port provided on a side of the processing section for processing the substrate; and a second load lock apparatus including a carry port provided on a side of the carry-in/out section for carrying the substrate in/out from/to the outside, and a carry port provided on a side of the processing section for processing the substrate, each of the first load lock apparatus and the second load lock apparatus including a temperature controlling plate for controlling a temperature of the substrate carried in the load lock apparatus, each of the temperature controlling plates of the first load lock apparatus and the second load lock apparatus including a plate body made of a porous material, a temperature controller provided in the plate body, and a gas supply path for supplying a gas to the plate body, wherein the gas is controlled in temperature when passing through the plate body temperature-controlled by the temperature controller, blows out from a surface of the plate body, and is supplied to the substrate.

In these load lock apparatuses, the load lock section includes the first load lock apparatus and the second load lock apparatus which may be stacked one on the other.

Further, the present invention is a method of carrying a substrate from a carry-in/out section into a processing section via a load lock section, and processing the substrate in the processing section, including the steps of: opening a carry port provided on the carry-in/out section side of the load lock section with a carry port provided on the processing section side of the load lock section kept closed, and carrying the substrate into the load lock section via the carry port provided on the carry-in/out section side; closing the carry port provided on the carry-in/out section side, bringing a temperature controlling plate including a plate body made of a porous material close to a front surface or a rear surface of the substrate, passing a temperature controlling gas controlled in temperature through the plate body, and supplying the gas from the plate body to the substrate to control a temperature of the substrate; and opening the carry port provided on the processing section side with the carry port provided on the carry-in/out section side kept closed, and carrying the substrate into the processing section via the carry port provided on the processing section side.

Further, the present invention is a method of carrying a substrate from a carry-in/out section into a processing section via a load lock section, and processing the substrate in the processing section, including the steps of: opening a carry port provided on the carry-in/out section side of the load lock section with a carry port provided on the processing section side of the load lock section kept closed, and carrying the substrate into the load lock section via the carry port provided on the carry-in/out section side; closing the carry port provided on the carry-in/out section side, bringing a temperature controlling plate including a plate body made of a porous material close to a front surface or a rear surface of the substrate, controlling a temperature of a temperature controller provided in the plate body, passing a gas through the plate body to control a temperature of the gas by the plate body temperature-controlled by the temperature controller, and supplying the gas controlled in temperature from the plate body to the substrate to control of a temperature of the substrate; and opening the carry port provided on the processing section side with the carry port provided on the carry-in/out section side kept closed, and carrying the substrate into the processing section via the carry port provided on the processing section side.

In these substrate processing methods, a pressure in the processing section may be reduced below a pressure in the carry-in/out section, after the substrate is carried into the load lock section, the carry port provided on the carry-in/out section side may be closed to bring an inside of the load lock section into a hermetically closed state; and after a pressure in the load lock section may be reduced to a predetermined pressure, the carry port provided on the processing section side may be opened, and the substrate may be carried out of the load lock section to the processing section.

It should be noted that in the present invention, the temperature controlling plate is embodied as a heating plate or a cooling plate. Further, the temperature controller is embodied as a heating element or a cooing water conveyance pipe.

According to the present invention, the plate body of the heating plate is made of a porous material, thereby allowing the temperature controlling gas to pass through the pores in the plate body. The temperature controlling gas can uniformly blow out from the surface of the plate body so that the temperature controlling gas can be evenly sprayed to the entire front surface or the entire rear surface of the substrate. Thus, the front surface or the rear surface of the substrate can be efficiently and uniformly temperature-controlled by the temperature controlling gas. Further, the temperature controller controls the temperature of the plate body while temperature-controlling the gas passing through the plate body, and the temperature-controlled gas can be sprayed to the substrate to efficiently temperature-control the substrate.

BRIEF DESCRIPTION OF THE DRAWINGS

FIG. 11 is a longitudinal sectional view of a lower surface cooling plate according to another embodiment.

DETAILED DESCRIPTION OF THE PREFERRED EMBODIMENT

Figure 1:
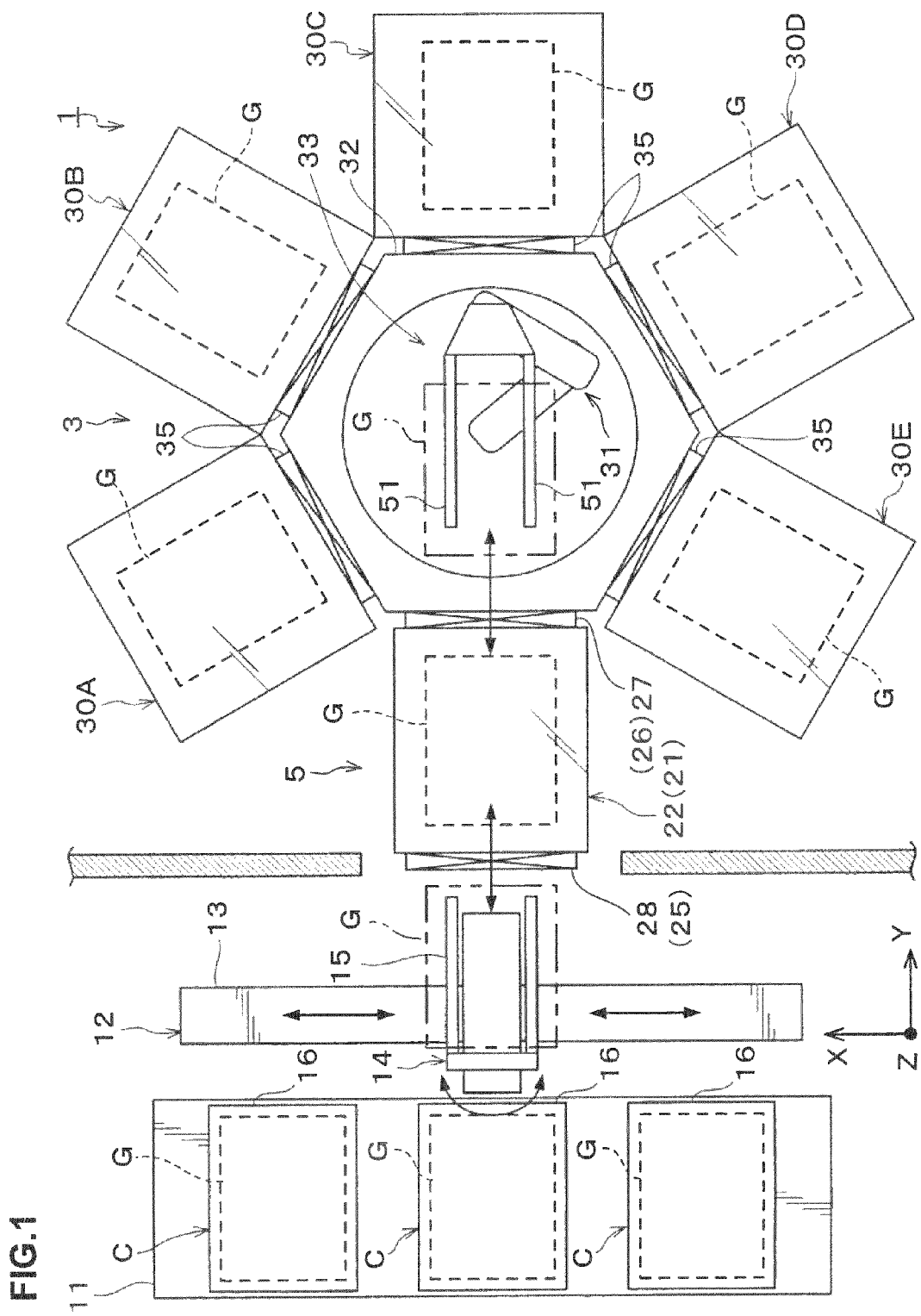
FIG. 1 is a schematic plan view illustrating a configuration of a processing system.

Hereinafter, a first embodiment of the present invention will be described based on a processing system which embodies processes of forming a thin film by plasma CVD (Chemical Vapor Deposition) processing for a glass substrate G for LCD (Liquid Crystal Display) as an example of a substrate. FIG. 1 is a plan view showing a schematic configuration of a processing system 1 according to the embodiment of the present invention. The processing system 1 shown in FIG. 1 is a so-called multi-chamber type processing system which includes a carry-in/out section 2 for carrying the substrate G in/out from/to the outside of the processing system 1, and a processing section 3 for performing CVD processing for the substrate G. A load lock section 5 is arranged between the carry-in/out section 2 and the processing section 3.

Figure 2:
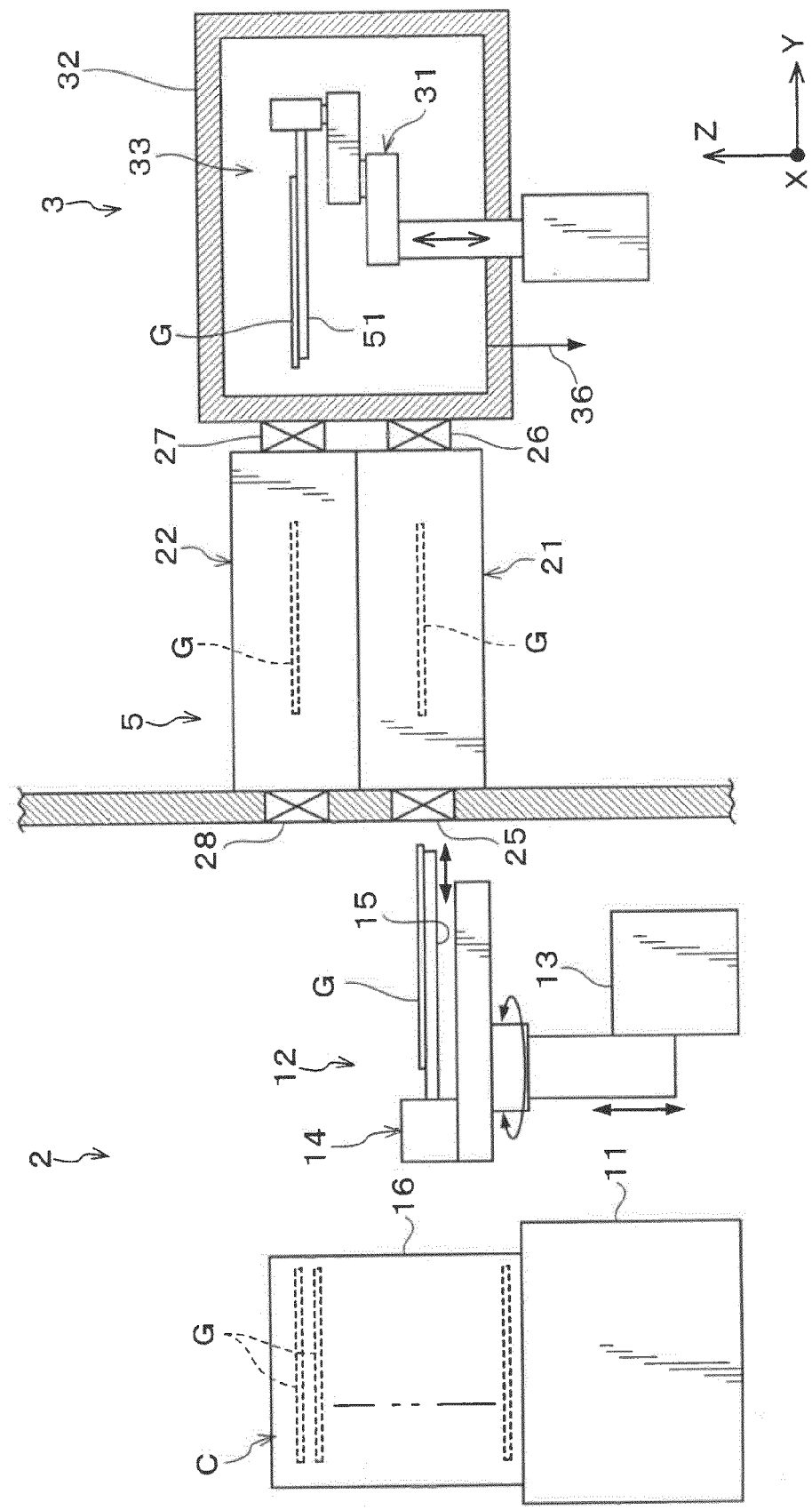
FIG. 2 is a schematic side view illustrating the configuration of the processing system.

In the carry-in/out section 2, a mounting table 11 on which cassettes C each housing a plurality of substrates G are mounted and a first carrier unit 12 for carrying the substrate G are provided. On the mounting table 11, a plurality of the cassettes C are arranged along an X-axis direction that is a substantially horizontal direction in FIG. 1. As shown in FIG. 2, a plurality of substantially rectangular substrates G in a thin plate shape are housed in each of the cassettes C on the mounting table 11 such that they are arranged one above the other, each in a substantially horizontal position.

The carrier unit 12 is provided at the rear (the right side in FIG. 1) of the mounting table 11 in a Y-axis direction in the horizontal direction. The carrier unit 12 further includes a rail 13 extending along the X-axis direction and a carrier mechanism 14 movable in the horizontal direction along the rail 13. The carrier mechanism 14 includes a carrier arm 15 for holding one substrate G in the substantially horizontal direction, and the carrier arm 15 is configured to be able to expand and contract in a Z-axis direction (the vertical direction) and rotatable within a substantially horizontal plane. In other words, the carrier unit 12 is configured such that the carrier arm 15 can access an opening 16 provided in the front surface of each cassette C on the mounting table 11 so as to take and put the substrates G one by one out/into the carrier unit 12. Further, the carrier arm 15 can access the load lock section 5 provided on the side (at the rear of the carrier unit 12 in the Y-axis direction) opposed to the mounting table 11 across the carrier unit 12 so as to carry-in and carry-out the substrates G one by one to/from the load lock section 5.

As shown in FIG. 2, the load lock section 5 is composed of a pair of load lock apparatuses, that is, a first load lock apparatus 21 and a second load lock apparatus 22. The first load lock apparatus 21 and the second load lock apparatus 22 are provided stacked one on the other such that the second load lock apparatus 22 is stacked on the first load lock apparatus 21 in the illustrated example. Further, a gate valve 25, which opens/closes a later-described carry-in port 63, of the load lock apparatus 21 is provided on the front side (the left side in FIG. 2) of the load lock apparatus 21 in the Y-axis direction, and a gate valve 26, which opens/closes a later-described carry-out port 64, of the load lock apparatus 21 is provided on the rear side of the load lock apparatus 21 in the Y-axis direction. A gate valve 27, which opens/closes a later-described carry-in port 103, of the load lock apparatus 22 is provided on the rear side of the second load lock apparatus 22 in the Y-axis direction, and a gate valve 28, which opens/closes a later-described carry-out port 104, of the load lock apparatus 22 is provided on the front side of the load lock apparatus 22 in the Y-axis direction. In this configuration, closing the gate valves 25 and 28 allows the atmosphere in the carry-in/out section 2 to be shut off from the atmospheres in the load lock apparatuses 21 and 22 respectively. Further, closing the gate valves 26 and 27 allows the atmosphere in the processing section 3 to be shut off from the atmospheres in the load lock apparatuses 21 and 22 respectively. The structure of each of the load lock apparatuses 21 and 22 will be described later in detail.

As shown in FIG. 1, the processing section 3 includes a plurality of, for example, five substrate processing apparatuses 30A to 30E each housing the substrate G and performing plasma CVD processing for it, and a second carrier unit 31 for carrying the substrate G between load lock section 5 and each of the substrate processing apparatuses 30A to 30E. The second carrier unit 31 is stored in a carrier room 33 provided in a chamber 32 having a hermetically closed structure. The chamber 32 is provided at the rear of the load lock section 5 in the Y-axis direction. Further, the load lock section 5 and the substrate processing apparatuses 30A to 30E are arranged in a manner to surround the periphery of the chamber 32.

Between the carrier room 33 and the load lock apparatuses 21 and 22, the above-described gate valves 26 and 27 are provided respectively, so that the gate valves 26 and 27 can shut off the atmosphere in the carrier room 33 from the atmospheres in the load lock apparatuses 21 and 22 respectively. Between the carrier room 33 and the substrate processing apparatuses 30A to 30E, gate valves 35 are provided respectively, so that the gate valves 35 can hermetically closes openings of the substrate processing apparatuses 30A to 30E to shut off the atmosphere in the carrier room 33 from the atmospheres in the substrate processing apparatuses 30A to 30E respectively. Further, as shown in FIG. 2, an exhaust path 36 is provided for forcibly evacuating the carrier room 33 to reduce the pressure therein. At the time of processing in the processing system 1, the atmospheres in the carrier room 33 of the processing section 3 and the substrate processing apparatuses 30A to 30E are reduced in pressure to be lower than that in the carry-in/out section 2, for example, into a vacuum state.

The second carrier unit 31 includes, for example, an articulated carrier arm 51. The carrier arm 51 is configured to be able to substantially horizontally hold one or a plurality of substrates Q and expand and contract in the Z-axis direction and rotatable within a substantially horizontal plane. Thus, the second carrier unit 31 is configured such that the carrier arm 51 can access the load lock apparatuses 21 and 22 and the substrate processing apparatuses 30A to 30E via the gate valves 26, 27, and 35 so as to carry-in or carry-out the substrates G one by one to/from them.

Figure 3:
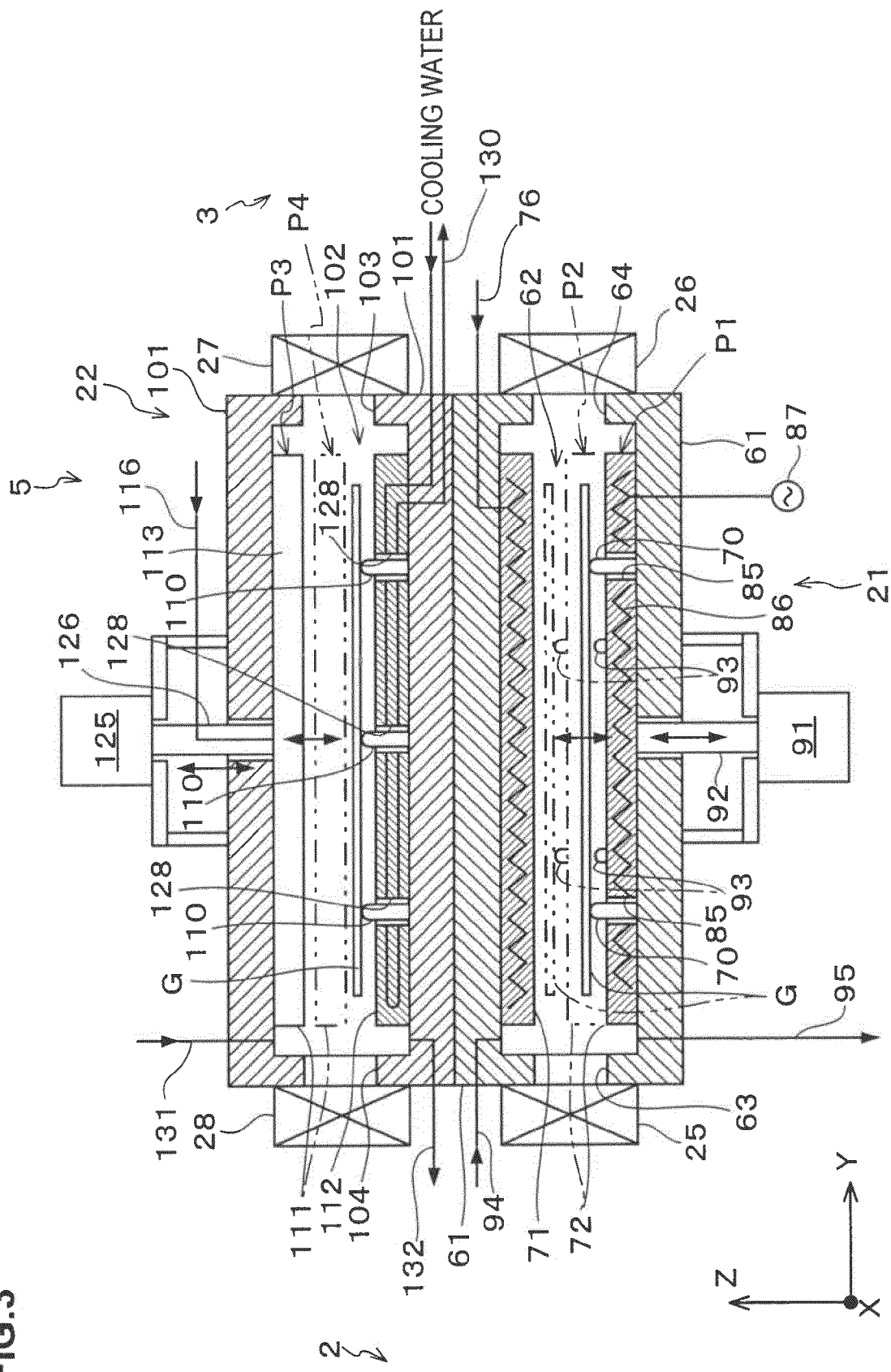
FIG. 3 is a schematic longitudinal sectional view of a load lock apparatus.

Next, the configuration of the aforementioned load lock apparatus 21 will be described in detail. As shown in FIG. 3, the load lock apparatus 21 includes a chamber 61 having a hermetically closed structure. The inside of the chamber 61 forms a load lock chamber 62 for housing the substrate G.

On the carry-in/out section 2 side, that is, on the front side in the Y-axis direction of the chamber 61, the carry-in port 63 is provided for carrying the substrate G into the load lock chamber 62. The carry-in port 63 is provided with the above-described gate valve 25 so that the carry-in port 63 can be hermetically closed by the gate valve 25. On the processing section 3 side, that is, on the rear side in the Y-axis direction of the chamber 61, the carry-out port 64 is provided for carrying the substrate G out of the load lock chamber 62. The carry-out port 64 is provided with the above-described gate valve 26 so that the carry-out port 64 can be hermetically closed by the gate valve 26.

In the load lock chamber 62, a plurality of holding members 70 are provided for supporting the substrate G. Each of the holding members 70 forms a substantially rod shape and is provided in a manner to project upward from the bottom of the chamber 61 so that the lower surface of the substrate G is mounted on the top end portions of the holding members 70, whereby the holding members 70 substantially horizontally support the substrate G.

Further, an upper surface heating plate 71 as a first heating plate for heating the substrate G supported on the holding members 70 and a lower surface heating plate 72 as a second heating plate are provided in the load lock chamber 62.

Figure 4:
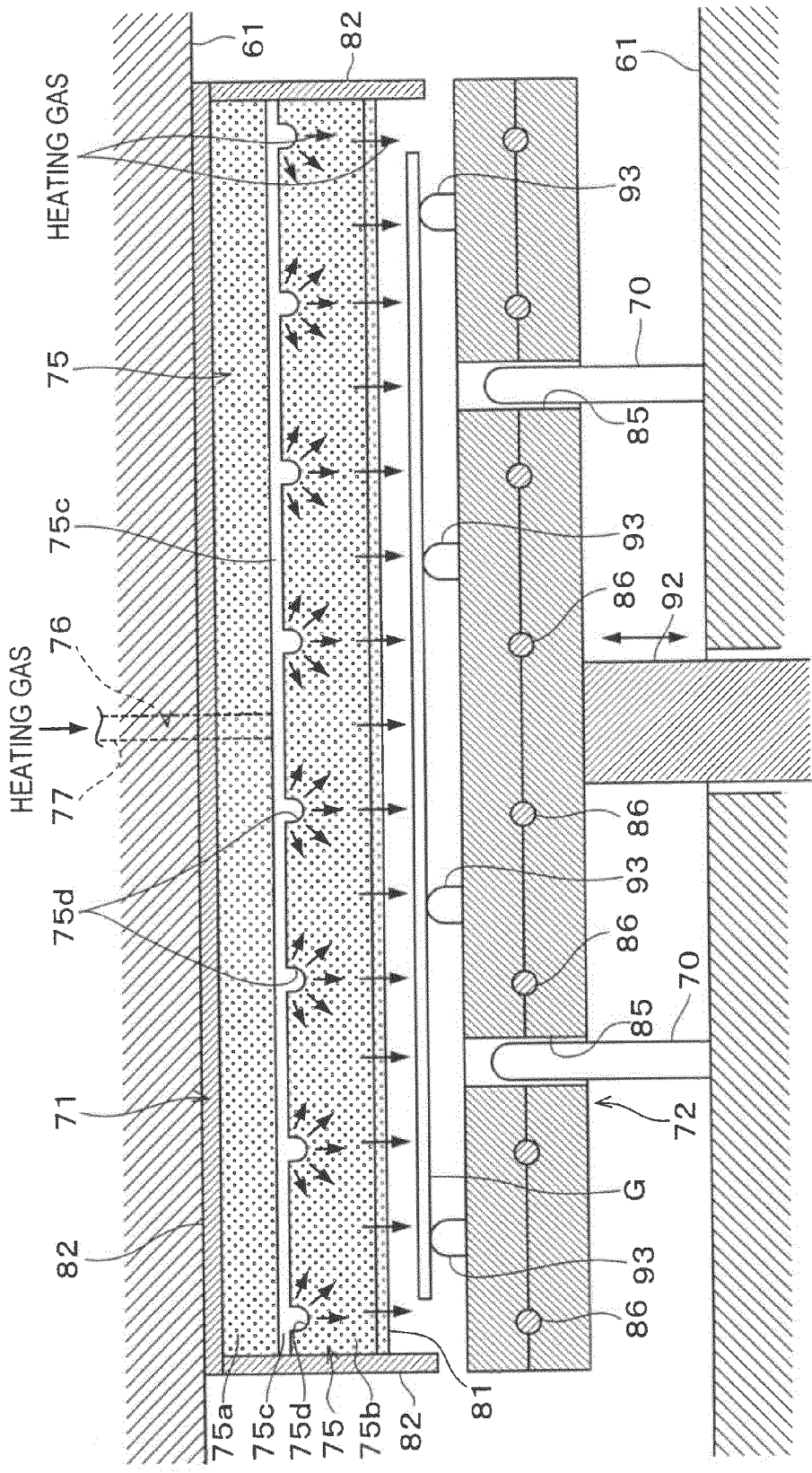
FIG. 4 is a longitudinal sectional view of an upper surface heating plate and a lower surface heating plate.

The upper surface heating plate 71 is placed on the upper surface (for example, the front surface on which devices are to be formed) side of the substrate G supported on the holding members 70, and secured to the chamber 61. As shown in FIG. 4, the upper surface heating plate 71 comprises a plate body 75 made of a porous base material with permeability and a heating gas supply path 76 for supplying a heating gas flowing through the plate body 75.

The plate body 75 forms a substantially rectangular thick plate, and is substantially horizontally provided along the ceiling of the chamber 61. Further, the plate body 75 is opposed to the upper surface of the substrate G supported on the holding members 70 in a position substantially parallel to the upper surface. The lower surface of the plate body 75 has an area substantially the same as or larger than that of the upper surface of the substrate G so that it can heat the upper surface of the substrate G in a manner to cover the entire upper surface. Furthermore, the plate body 75 is configured such that it is divided into two, upper and lower, parts and a gap 75$c$ with a substantially uniform width and extending in a substantially horizontal direction is formed between an upper plate 75$a$ and a lower plate 75$b$. An upper surface of the lower plate 75$b$ facing the gap 75$c$ is provided with a plurality of grooves 75$d$ which are recessed downward in a hollow shape. The grooves 75$d$ are provided such that they extend, for example, in an X-axis direction at predetermined intervals in a Y-axis direction over the entire upper surface of the lower plate 75$b$. Further, to the gap 75$c$, a supply pipe 77 is connected which supplies the heating gas heated in an external part of the chamber 61. The supply pipe 77 is provided in a manner to penetrate through the ceiling portion of the chamber 61 and the upper plate 75$a$, and opens on the lower surface of the upper plate 75$a$ toward the gap 75$c$. It is preferable to use, as the heating gas, for example, an inert gas such as $N_2$ (nitrogen) gas, He (helium) gas or the like. In this embodiment, the heating gas supply path 76 is constituted of the internal flow passage of the supply pipe 77, the gap 75$c$, and the grooves 75$d$.

The lower surface of the plate body 75 (that is, the lower surface of the lower plate 75$b$) opposing to the upper surface of the substrate G supported on the holding members 70 is covered with a permeable protection film 81. The permeable protection film 81 is formed on the entire lower surface of the plate body 75 with a substantially uniform thickness. Further, the upper surface of the plate body 75 (that is, the upper surface of the upper plate 75$a$) is covered with a non-permeable thin-film protection material 82. The outer side surface of the plate body 75 is also covered with the non-permeable thin-film protection material 82 extending from the upper plate 75$a$ to the lower plate 75$b$. The peripheral portion of the gap 75$c$ is also covered with the non-permeable protection material 82 and is thus closed. The plate body 75 is secured to the chamber 61 via the non-permeable protection material 82. Thus, the permeable protection film 81 and the non-permeable protection material 82 cover the outer surface of the porous material of the plate body 75 to preferably protect the porous material, thereby preventing the porous material from being damaged. Note that the non-permeable protection material 82 may be provided to extend to a point below the lower surface of the plate body 75 and the permeable protection film 81. This configuration allows the non-permeable protection material 82 to surround a portion outside the peripheral portion of the substrate G when the substrate G is heated, thereby preventing the heating gas supplied from the lower surface of the plate body 75 from escaping to the outside of the non-permeable protection material 82 to cause the heating gas to concentrate onto the upper surface of the substrate G as described later. Thus, the efficiency of heating by the heating gas can be improved.

The porous material forming the plate body 75 has a structure in which many interconnected pores are formed in a base material so that a fluid can flow between the pores. Therefore, when the heating gas is supplied to the heating gas supply path 76, the heating gas can permeate through the plate body 75. Since the upper surface and the outer side surface of the plate body 75 are covered with the non-permeable protection material 82, the heating gas introduced from the supply pipe 77 into the gap 75c flows toward the lower surface of the plate body 75, passes through the permeable protection film 81, and blows downward. Thus, the heating gas sprayed from the lower surface of the plate body 75 and the heat emitted from the plate body 75 heated by the heating gas passing therethrough heat the substrate G. Note that formation of the plurality of groves 75d in the lower plate 75b provides a structure in which the heating gas in the gap 75c easily flows from the grooves 75d into the pores in the lower plate 75b.

It is preferable to use, as the porous material forming the aforementioned plate body 75, a material with relatively excellent thermal conductivity and thermal emissivity, such as porous carbon (C) or the like. In this case, the plate body 75 can be efficiently heated and easily heated by the heating gas. Note that the uniformity of temperature distribution within the plate body 75 can be improved, so that heat can be evenly emitted from the lower surface of the plate body 75, thus preventing uneven heating of the substrate G. Further, high heat-resistance, and stable and sufficient durability even at high temperatures can be obtained, so that the substrate G can be heated to high temperatures. Note that the permeable protection film 81 and the non-permeable protection material 82 covering the porous material carbon can prevent carbon from being wasted due to oxidation, and particles from adhering to the substrate G. Moreover, the heating gas, if using an inert gas, can prevent carbon from being wasted due to oxidation, resulting in excellent durability. A porous metal, such as a porous aluminum (Al) alloy, a porous nickel (Ni) alloy, or the like may also be used.

It is preferable to use, as the material of the permeable protection film 81, a material with high heat-resistance, a high thermal emissivity, and a coefficient of thermal expansion close to that of the porous material of the plate body 75 and, for example, ceramics such as alumina ($Al_2O_3$) and the like may be used. This can surely protect the porous material of the plate body 75 even at high temperatures. If a material having a high thermal emissivity, for example, alumina is used as the material of the permeable protection film 81, the permeable protection film 81 can efficiently emit heat to the substrate G to accelerate heating of the substrate G. Moreover, the permeable protection film 81 can evenly emit heat to prevent uneven heating from occurring within the substrate G. The permeable protection film 81 may also be formed by, for example, thermal spraying. This can preferably form a permeable film having many pores. Note that when a porous aluminum alloy is used as the porous material of the plate body 75, the permeable protection film 81 may be formed by subjecting its surface to alumite treatment (oxidation treatment).

As the material of the non-permeable protection material 82, a heat-resistant material, for example, ceramics and the like may be used. This can surely protect the porous material of the plate body 75 even at high temperatures. Further, it is preferable to use a material with a relatively high heat-insulating property as the material of the non-permeable protection material 82. This can prevent the heat in the plate body 75 from escaping from the upper surface or the outer side surface of the plate body 75, thereby allowing the permeable protection film 81 at the lower surface of the plate body 75 to emit heat in a concentrated manner. Consequently, the efficiency of heating the substrate G can be improved.

As shown in FIG. 3, the lower surface heating plate 72 forms a substantially rectangular thick plate, and is substantially horizontally provided along the bottom of the chamber 61, placed on the lower surface (for example, the rear surface on which no device is to be formed) side of the substrate G supported on the holding members 70. The above-described holding members 70 are arranged within a plurality of holes 85 formed in the lower surface heating plate 72 respectively. The lower surface heating plate 72 is opposed to the lower surface of the substrate G held on the holding members 70 in a position substantially parallel to the lower surface. Note that the upper surface of the lower surface heating plate 72 has an area substantially the same as or larger than that of the lower surface of the substrate G so that it can heat the lower surface of the substrate G in a manner to cover the entire lower surface.

The lower surface heating plate 72 incorporates a heating element 86, such as a sheathed heater or the like. The heating element 86 is connected to an alternating-current power supply 87 provided outside the chamber 61. More specifically, the power supplied from the alternating-current power supply 87 generates resistance heat of the heating element 86 so that the heat transferred from the heating element 86 raises the temperature of the lower surface heating plate 72.

Further, the lower surface heating plate 72 is configured to be able to vertically raised and lowered. For example, as shown in FIG. 3, a cylinder 91 is provided below the chamber 61 as a raising and lowering mechanism, and a rod 92 connected to the cylinder 91 is provided in a manner to vertically penetrate the bottom of the chamber 61. The lower surface heating plate 72 is attached to the upper end portion of the rod 92. Driving of the cylinder 91 raises and lowers the rod 92 in the Z-axis direction, whereby the lower surface heating plate 72 is raised and lowered integrally with the rod 92 with the holes 85 moving along the respective holding members 70.

Further, the upper surface of the lower surface heating plate 72 is provided with a plurality of supporting members 93 for supporting the substrate G at the time of heating. When the lower surface heating plate 72 is lowered to a waiting position P1, the supporting members 93 are located at positions lower than the top end portions of the holding members 70. Therefore, even if the substrate G is held on the holding members 70, the supporting members 93 never touch the substrate G. On the other hand, the lower surface heating plate 72 can be raised from the waiting position P1 to lift the substrate G held on the holding members 70 by the supporting members 93, so that the substrate G can be brought close to the above-described upper surface heating plate 71. In other words, the upper surface heating plate 71 and the lower surface heating plate 72 are configured so that they can be respectively brought close to and away from the substrate G housed between them. The lower surface heating plate 72 configured to be raised and lowered as described above makes it possible that at the time of passing the substrate G to the holding members 70, the lower surface heating plate 72 is lowered to the waiting position P1 to enable easy passing, and that at the time of heating the substrate G, the lower surface heating plate 72 is raised to the heating processing position P2 to enable efficient heating of the substrate G.

Further, a gas supply path 94 for supplying an inert gas such as $N_2$ (nitrogen) gas, He (helium) gas or the like into the load lock chamber 62 and an exhaust path 95 for forcibly evacuating the load lock chamber 62 are connected to the chamber 62. In other words, the gas supply from the gas supply path 94 and the forcible evacuation through the exhaust path 95 enable adjustment of the pressure in the load lock chamber 62.

Next, the configuration of the aforementioned load lock apparatus 22 will be described in detail. As shown in FIG. 3, the load lock apparatus 22 includes a chamber 101 having a hermetically closed structure. In the illustrated example, the chamber 101 is mounted on the top surface of the chamber 61 of the load lock apparatus 21 at the lower tier. The inside of the chamber 101 forms a load lock chamber 102 for housing the substrate G.

On the processing section 3 side, that is, on the rear side in the Y-axis direction of the chamber 101, the carry-in port 103 is provided for carrying the substrate G into the load lock chamber 102. The carry-in port 103 is provided with the above-described gate valve 27 so that the carry-in port 103 can be hermetically closed by the gate valve 27. On the carry-in/out section 2 side, that is, on the front side in the Y-axis direction of the chamber 101, the carry-out port 104 is provided for carrying the substrate G out of the load lock chamber 102. The carry-out port 104 is provided with the above-described gate valve 28 so that the carry-out port 104 can be hermetically closed by the gate valve 28.

In the load lock chamber 102, a plurality of supporting members 110 are provided for holding the substrate G. Each of the holding members 110 forms a substantially rod shape and is provided in a manner to project upward from the bottom of the chamber 101 so that the lower surface of the substrate G is mounted on the top end portions of the supporting members 110, whereby the holding members 110 substantially horizontally support the substrate G.

Further, an upper surface cooling plate 111 as a first cooling plate for cooling the substrate G and a lower surface cooling plate 112 as a second cooling plate are provided in the load lock chamber 102.

Figure 5:
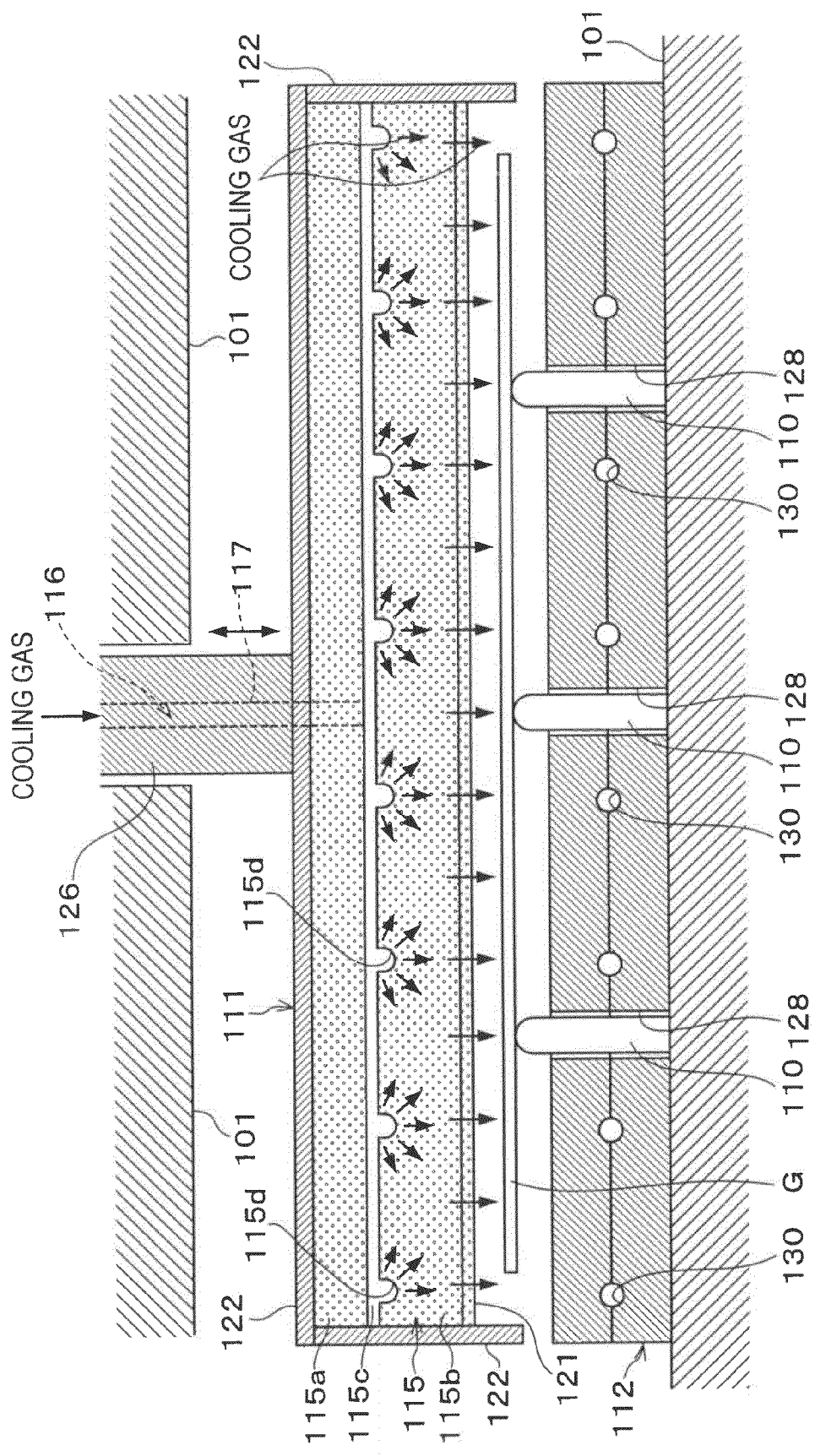
FIG. 5 is a longitudinal sectional view of an upper surface cooling plate and a lower surface cooling plate.

As shown in FIG. 5, the upper surface cooling plate 111 is placed on the upper surface (for example, the front surface on which devices are to be formed) side of the substrate G supported on the supporting members 110. The upper surface cooling plate 111 comprises a plate body 115 made of a porous material with permeability, and a cooling gas supply path 116 for supplying a cooling gas flowing through the plate body 115.

The plate body 115 forms a substantially rectangular thick plate, and is substantially horizontally provided along the ceiling of the chamber 101. Further, the plate body 115 is opposed to the upper surface of the substrate G supported on the supporting members 110 in a position substantially parallel to the upper surface. The lower surface of the plate body 115 has an area substantially the same as or larger than that of the upper surface of the substrate G so that it can cool the upper surface of the substrate G in a manner to cover the entire upper surface. Furthermore, the plate body 115 is configured such that it is divided into two, upper and lower, parts and a gap 115c with a substantially uniform width and extending in a substantially horizontal direction is formed between an upper plate 115a and a lower plate 115b. An upper surface of the lower plate 115b facing the gap 115c is provided with a plurality of grooves 115d which are recessed downward in a hollow shape. The grooves 115d are provided such that they extend, for example, in the X-axis direction at predetermined intervals in the Y-axis direction over the entire upper surface of the lower plate 115b. Further, to the gap 115c, a supply pipe 117 is connected which supplies the cooling gas cooled in an external part of the chamber 101. The supply pipe 117 is provided in a manner to penetrate through, for example, a later-described rod 126 supporting the upper surface cooling plate 111 and through the upper plate 115a, and opens on the lower surface of the upper plate 115a toward the gap 115c. It is preferable to use, as the cooling gas, for example, an inert gas such as $N_2$ (nitrogen) gas, He (helium) gas or the like. In this embodiment, the cooling gas supply path 116 is constituted of the internal flow passage of the supply pipe 117, the gap 115c, and the grooves 115d.

The lower surface of the plate body 115 (that is, the lower surface of the lower plate 115b) opposing to the upper surface of the substrate G supported on the holding members 110 is covered with a permeable protection film 121. The permeable protection film 121 is formed on the entire lower surface of the plate body 115 with a substantially uniform thickness. Further, the upper surface of the plate body 115 (that is, the upper surface of the upper plate 115a) is covered with a non-permeable thin-film protection material 122. The outer side surface of the plate body 115 is also covered with the non-permeable thin-film protection material 122 extending from the upper plate 115a to the lower plate 115b. The peripheral portion of the gap 115c is also covered with the non-permeable protection material 122 and is thus closed. The plate body 115 is secured to the chamber 101 via the non-permeable protection material 122. Thus, the permeable protection film 121 and the non-permeable protection material 122 cover the outer surface of the porous material of the plate body 115 to preferably protect the porous material, thereby preventing the porous material from being damaged. Note that the non-permeable protection material 122 may be provided to extend to a point below the lower surface of the plate body 115 and the permeable protection film 121. This configuration allows the non-permeable protection material 122 to surround a portion outside the peripheral portion of the substrate G when the substrate G is cooled, thereby preventing the cooling gas supplied from the lower surface of the plate body 115 from escaping to the outside of the non-permeable protection material 122 to cause the cooling gas to concentrate onto the upper surface of the substrate G as described later. Thus, the efficiency of cooling by the cooling gas can be improved.

The porous material forming the plate body 115 has a structure in which many interconnected pores are formed in a base material so that a fluid can flow between the pores. Therefore, when the cooling gas is supplied to the cooling gas supply path 116, the cooling gas can permeate through the plate body 115. Since the upper surface and the outer side surface of the plate body 115 are covered with the non-permeable protection material 122, the cooling gas introduced from the supply pipe 117 into the gap 115c flows toward the lower surface of the plate body 115, passes through the permeable protection film 121, and blows downward. Thus, the cooling gas sprayed from the lower surface of the plate body 115 and the cold heat of the plate body 115 cooled by the cooling gas passing therethrough cool the substrate G. Note that formation of the plurality of groves 115d in the lower plate 115b provides a structure in which the cooling gas in the gap 115c easily flows from the grooves 115d into the pores in the lower plate 115b.

As the porous material forming the aforementioned plate body 115, a material may be used which has relatively excellent thermal conductivity and thermal emissivity, for example, a porous metal such as a porous aluminum alloy or the like. Further, a porous nickel alloy, porous carbon or the like may be used. The use of such porous material with excellent thermal conductivity can efficiently cool the plate body 115 and the cooling gas can easily cool the plate body 115. Moreover, the uniformity of temperature distribution within the plate body 115 can be improved, so that cold heat can be evenly supplied from the lower surface of the plate body 115, thus preventing uneven cooling of the substrate G.

It is preferable to use, as the material of the permeable protection film 121, a material with a high thermal emissivity and a coefficient of thermal expansion close to that of the porous material of the plate body 115 and, for example, ceramics such as alumina ($Al_2O_3$) and the like may be used. This can surely protect the porous material of the plate body 115. The permeable protection film 121 may also be formed by, for example, thermal spraying. This can preferably form a permeable film having many pores. Note that when a porous aluminum alloy is used as the porous material of the plate body 115, the permeable protection film 121 may be formed by subjecting its surface to alumite treatment (oxidation treatment).

As the material of the non-permeable protection material 122, for example, ceramics and the like may be used. This can surely protect the porous material of the plate body 115. Further, it is preferable to use a material with a relatively high heat-insulating property as the material of the non-permeable protection material 122. This can prevent the cold heat in the plate body 115 from escaping from the upper surface of the outer side surface of the plate body 115, thereby allowing the permeable protection film 121 at the lower surface of the plate body 115 to be cooled in a concentrated manner. Consequently, the efficiency of cooling the substrate G can be improved.

The upper surface cooling plate 111 is configured to be able to vertically raised and lowered so that it can approach and separate from the substrate G supported on the supporting members 110. For example, as shown in FIG. 3, a cylinder 125 is provided above the chamber 101 as a raising and lowering mechanism, and a rod 126 connected to the cylinder 125 is provided in a manner to vertically penetrate the ceiling of the chamber 101. The upper surface cooling plate 111 is attached to the lower end portion of the rod 126. Driving of the cylinder 125 raises and lowers the rod 126 in the Z-axis direction, whereby the upper surface cooling plate 111 is raised and lowered integrally with the rod 126. The upper surface cooling plate 111 moves, for example, to a waiting position P3 at an upper position away from the substrate G supported on the supporting members 110 and to a cooling processing position P4 at a lower position close to the substrate G. The upper surface cooling plate 111 configured to be raised and lowered in the above manner makes it possible that at the time of passing the substrate G to the supporting members 110, the upper surface cooling plate 111 is raised to the waiting position P3 to enable easy passing, and that at the time of cooling the substrate G, the upper surface cooling plate 111 is lowered to the cooling processing position P4 to enable efficient cooling of the substrate G. Note that the upper surface cooling plate 111 employs a porous material and is therefore lightweight so that it can be easily raised and lowered by a small driving force.

The lower surface cooling plate 112 forms a substantially rectangular thick plate, and is substantially horizontally provided along the bottom of the chamber 101, placed on the lower surface (for example, the rear surface on which no device is to be formed) side of the substrate G supported on the supporting members 110, and secured to the chamber 101. The above-described supporting members 110 are arranged within a plurality of holes 128 formed in the lower surface cooling plate 112 respectively. The lower surface cooling plate 112 is opposed to the lower surface of the substrate G supported on the holding members 110 in a position substantially parallel to the lower surface. The upper surface of the lower surface cooling plate 112 has an area substantially the same as or larger than that of the lower surface of the substrate G so that it can cool the lower surface of the substrate G in a manner to cover the entire lower surface.

The lower surface cooling plate 112 incorporates a cooling water conveyance pipe 130 for passing a cooling water therethrough. The cooling water conveyance pipe 130 is connected to a not-shown cooling water supply source provided outside the chamber 101. The cooling water is supplied from the cooling water supply source, circulates in the cooling water conveyance pipe 130 in the lower surface cooling plate 112 to cool the lower surface cooling plate 112, and is recovered in an external part of the lower surface cooling plate 112.

Further, a gas supply path 131 for supplying an inert gas such as $N_2$ (nitrogen) gas, He (helium) gas or the like into the load lock chamber 102 and an exhaust path 132 for forcibly evacuating the load lock chamber 102 are connected to the chamber 102. In other words, the gas supply from the gas supply path 131 and the forcible evacuation through the exhaust path 132 enable adjustment of the pressure in the load lock chamber 102.

Next, a process of processing the substrate G in the processing system 1 configured as described above will be described. The cassette C housing a plurality of substrates G is first mounted on the mounting table 11 with its opening 16 directed to the carrier unit 12 side. The carrier arm 15 of the carrier unit 12 is then caused to enter the opening 16 to take one substrate G. The carrier arm 15 holding the substrate G is moved to a position opposed to the front of the gate valve 25 of the load lock apparatus 21 located at the lower tier.

On the other hand, in the load lock apparatus 21, the carry-in port 63 and the carry-out port 64 are hermetically closed by the gate valves 25 and 26 respectively so that the load lock chamber 62 is hermetically closed. In the load lock apparatus 22, the carry-in port 103 and the carry-out port 104 are closed by the gate valves 27 and 28 respectively so that the load lock chamber 102 is hermetically closed. Accordingly, the atmosphere in the carry-in/out section 2 and the atmosphere in the carrier room 33 in the processing section 3 are shut off from each other via the load lock apparatuses 21 and 22. The atmosphere in the carry-in/out section 2 is, for example, at the atmospheric pressure, though the carrier room 33 is evacuated.

In the load lock apparatus 21, the pressure in the load lock apparatus 21 is maintained at the substantially atmospheric pressure almost equal to that in the carry-in/out section 2, and the carry-in port 63 is then opened by opening the gate valve 25 with the carry-out port 64 kept closed by the gate valve 26. Even during the carry-in port 63 kept open, the vacuum state in the carrier room 33 can be maintained by keeping the carry-out port 64 closed by the gate valve 26. Further, the lower surface heating plate 72 is lowered at the waiting position P1 in advance. In this state, the carrier arm 15 holding the substrate G is moved to enter the load lock chamber 62 via the carry-in port 63 to pass the substrate G onto the holding members 70.

After the substrate G is carried in via the carry-in port 63 and the carrier arm 15 retracts from the load lock chamber 62 as described above, the gate valve 25 is closed to bring the load lock chamber 62 into a hermetically closed state, and then the load lock chamber 62 is forcibly evacuated through the exhaust path 95, whereby the pressure in the load lock chamber 62 is reduced to a predetermined pressure for a vacuum state, that is, almost equal to the pressure in the carrier room 33.

On the other hand, the substrate G is heated from both surfaces by the upper surface heating plate 71 and the lower surface heating plate 72. The lower surface heating plate 72 is first raised from the waiting position P1. Then, at a midpoint of raising of the lower surface heating plate 72, the substrate G is lifted by the supporting members 93 from the holding members 70 and kept supported on the supporting members 93. The substrate G mounted and substantially horizontally supported on top ends of the supporting members 93 is raised integrally with the lower surface heating plate 72 and is brought close to the upper surface heating plate 71. This results in a state where the lower surface heating plate 72 is located at the heating processing position P2 so that the lower surface of the upper surface heating plate 71 is brought close to the entire upper surface of the substrate G and the upper surface of the lower surface heating plate 72 is brought close to the entire lower surface of the substrate G. Between the lower surface of the substrate G and the upper surface of the lower surface heating plate 72 and between the upper surface of the substrate G and the lower surface of the upper surface heating plate 71, clearances with respective substantially uniform widths are formed. Moreover, the lower peripheral portion of the non-permeable protection material 82 provided in a matter to project from the lower surface peripheral portion of the upper surface heating plate 71 is placed such that the lower peripheral portion is close to the upper surface peripheral portion of the lower surface heating plate 72 so as to surround the substrate G as shown in FIG. 4.

The upper surface of the lower surface heating plate 72 is uniformly raised in temperature by heat transfer from the heating element 86, so that the lower surface of the substrate G is uniformly heated by radiation heat from the upper surface of the lower surface heating plate 72. On the other hand, in the upper surface heating plate 71, the heating gas is supplied to the gap 75c from the supply pipe 77. The heating gas introduced into the gap 75c flows into the pores in the lower plate 75b. The gas then flows, diffusing into the lower plate 75b, toward the lower surface, passes through the pores in the permeable protection film 81, and blows downward from the permeable protection film 81 for discharge toward the upper surface of the substrate G. Thus, the heating gas comes into contact with the substrate G to heat the substrate G efficiently. The heating gas supplied from the plate body 75 onto the upper surface of the substrate G flows along the upper surface of the substrate G to the peripheral portion side of the substrate G, and flows out through the gap between the lower peripheral portion of the non-permeable protection material 82 and the upper surface peripheral portion of the lower surface heating plate 72, and is exhausted through the exhaust path 95.

Note that the heating gas introduced into the gap 75c from the supply pipe 77 diffuses to the entire gap 75a which extends to be larger than the area of the substrate G, and evenly permeates from the gap 75c into the entire upper surface of the lower plate 75b. When permeating from the gap 75c into the lower plate 75b, the gas easily evenly flows into the lower plate 75b via the plurality of grooves 75d formed in the lower plate 75b respectively. Accordingly, the heating gas evenly passes through the entire lower plate 75b and blows out in an equal flow rate from all the pores in the lower surface of the permeable protection film 81, whereby the heating gas can evenly heat the entire upper surface of the substrate G. Moreover, the above-described heating gas in the gap 75c also permeates and diffuses into the upper plate 75a to raise the temperature of the entire plate body 75. The substrate G is also heated by the radiation heat from the heated plate body 75. As described above, the heating gas evenly passing through the entire lower plate 75b evenly heats the entire lower plate 75b. Accordingly, the lower surface of the plate body 75 evenly emits radiation heat so that the substrate G can also be uniformly heated by the radiation heat. Furthermore, the lower peripheral portion of the non-permeable protection material 82 is placed around the substrate G so that the heating gas and the radiation heat can be supplied to the upper surface of the substrate G in a concentrated manner. This enables further efficient heating of the substrate G. Further, the lower peripheral portion of the non-permeable protection material 82 can prevent the substrate G from moving off from the space between the upper surface heating plate 71 and the lower surface heating plate 72.

By heating the substrate G from both surfaces as described above, the substrate G can be uniformly heated and can be also efficiently heated in a short time. It should be noted that if the heating plate is brought close only to one surface of the substrate G to heat the substrate G only from the one surface, there will occur a temperature difference between the surface on the side to be heated and the surface on the opposite side, which difference may present a concern that the thermal stress causes the substrate G to get warped. In contrast, heating the substrate G from both the surfaces can prevent occurrence of the temperature difference in the substrate G to prevent warpage of the substrate G.

After the heating of the substrate G is finished and the load lock chamber 62 is brought into an almost vacuum state, the carry-out port 64 is opened by opening the gate valve 26 with the carry-in port 63 kept closed by the gate valve 25. Even during the carry-out port 64 kept open, the vacuum state in the load lock chamber 62 and the carrier room 33 can be maintained by keeping the carry-in port 63 closed by the gate valve 25. Further, the lower surface heating plate 72 is lowered and returned to the waiting position P1. Then, at a midpoint of lowering of the lower surface heating plate 72, the holding members 70 butts against the lower surface of the substrate G so that the substrate G is passed from the supporting members 93 onto the holding members 70, resulting in a state in which the substrate G is separated from the upper surface heating plate 71 and the lower surface heating plate 72. In this state, the carrier arm 51 of the second carrier unit 31 is moved to enter the load lock chamber 62 via the carry-out port 64. The carrier arm 51 then receives the substrate G from the holding members 70, and the carrier arm 51 holding the substrate G retracts from the load lock chamber 62. Thus, the substrate G is carried out of the load lock chamber 62 via the carry-out port 64 and carried into the carrier room 33 in the processing section 3.

The substrate G carried into the carrier room 33 is carried by the carrier arm 51 from the carrier room 33 into any of the substrate processing apparatuses 30A to 30E where the substrate G is subjected to film formation by the predetermined plasma CVD processing. In the one of the substrate processing apparatuses 30A to 30E, the substrate G is heated in a reduced pressure atmosphere, and a reaction gas is supplied into the processing chamber and made into plasma by energy of microwave. This forms a predetermined thin film on the surface of the substrate G. Since the carried-in substrate G has been pre-heated in the load lock chamber 62, the heating time of the substrate G in the one of the substrate processing apparatuses 30A to 30E can be reduced, resulting in efficient processing.

After completion of the processing of the substrate G in the one of the substrate processing apparatuses 30A to 30E, the carrier arm 51 takes the substrate G out of the one of the substrate processing apparatuses 30A to 30E and carries it out to the carrier room 33. At this time, the substrate G is at a high temperature.

On the other hand, in the load lock apparatus 22, the carry-in port 103 and the carry-out port 104 are hermetically sealed by the gate valves 27 and 28 in the closed state so that the load lock chamber 102 is kept hermetically closed. Further, the load lock chamber 102 is forcibly evacuated through the exhaust path 132, so that the pressure in the load lock chamber 102 is reduced to a predetermined pressure for a vacuum state, that is, almost equal to the pressure in the carrier room 33 in advance. In this state, the carry-in port 103 is opened by opening the gate valve 27 with the carry-out port 104 kept closed by the gate valve 28. Even during the carry-in port 103 kept open, the vacuum state in the load lock chamber 102 and the carrier room 33 can be maintained by keeping the carry-out port 104 closed by the gate valve 28. Further, the upper surface cooling plate 111 is kept waiting at the waiting position P3 in advance. The carrier arm 51 holding the substrate G enters the load lock chamber 102 via the carry-in port 103 so that the substrate G is then passed from the carrier arm 51 onto the supporting members 110.

After the substrate G is carried in via the carry-in port 103 and the carrier arm 51 retracts from the load lock chamber 102, the gate valve 27 is closed to bring the load lock chamber 102 into a hermetically closed state. The inert gas is then supplied from the gas supply path 131 into the load lock chamber 102 to increase the pressure in the load lock chamber 102 until the pressure in the load lock apparatus 22 is brought to a predetermined pressure, that is, a substantially atmospheric pressure almost equal to the pressure in the carry-in/out section 2.

On the other hand, the substrate G is cooled from both surfaces by the upper surface cooling plate 111 and the lower surface cooling plate 112. At the time of cooling, the upper surface cooling plate 111 is lowered to the cooling processing position P4. This results in a state where the lower surface of the upper surface cooling plate 111 is brought close to the entire upper surface of the substrate G, and the upper surface of the lower surface cooling plate 112 is brought close to the entire lower surface of the substrate G. Between the upper surface cooling plate 111 and the substrate G and between the lower surface cooling plate 112 and the substrate G, clearances with respective substantially uniform widths are formed. The lower peripheral portion of the non-permeable protection material 122 provided in a matter to project from the lower surface peripheral portion of the upper surface cooling plate 111 is placed such that the lower peripheral portion is close to the upper surface peripheral portion of the lower surface cooling plate 112 so as to surround the substrate G as shown in FIG. 5.

The upper surface of the lower surface cooling plate 112 is uniformly cooled by cold heat of the cooling water passing through the cooling water conveyance pipe 130, so that the lower surface of the substrate G is uniformly cooled by cold heat of the upper surface of the lower surface cooling plate 112. On the other hand, in the upper surface cooling plate 111, the cooling gas is supplied to the gap 115c from the supply pipe 117. The cooling gas introduced into the gap 115c flows into the pores in the lower plate 115b. The gas then flows, diffusing into the lower plate 115b, toward the lower surface, passes through the permeable protection film 121, and blows downward from the permeable protection film 121 for discharge toward the upper surface of the substrate G. Thus, the cooling gas comes into contact with the substrate G to cool the substrate G efficiently. The cooling gas supplied from the plate body 115 onto the upper surface of the substrate G flows along the upper surface of the substrate G to the peripheral portion side of the substrate G, and flows out through the gap between the lower peripheral portion of the non-permeable protection material 122 and the upper surface peripheral portion of the lower surface cooling plate 112 and is exhausted through the exhaust path 132.

Note that the cooling gas introduced into the gap 115c from the supply pipe 117 diffuses to the entire gap 115a which extends to be larger than the area of the substrate G, and evenly permeates from the gap 115c into the entire upper surface of the lower plate 115b. When permeating from the gap 115c into the lower plate 115b, the gas easily evenly flows into the lower plate 115b via the plurality of grooves 115d formed in the lower plate 115b respectively. Accordingly, the cooling gas evenly passes through the entire lower plate 115b and blows out in an equal flow rate from all the pores in the lower surface of the permeable protection film 121, whereby the cooling gas can evenly cool the entire upper surface of the substrate G. Moreover, the above-described cooling gas in the gap 115c also permeates and diffuses into the upper plate 115a to cool the entire plate body 115. The substrate G is also cooled by the cold heat from the cooled plate body 115. As described above, the cooling gas evenly passing through the entire lower plate 115b evenly cools the entire lower plate 115b. Accordingly, the substrate G can also be uniformly cooled by the cold heat of the plate body 115. Furthermore, the lower peripheral portion of the non-permeable protection material 122 is placed around the substrate G so that the cooling gas and the cold heat can be supplied to the upper surface of the substrate G in a concentrated manner. This enables further efficient cooling of the substrate G. Further, the lower peripheral portion of the non-permeable protection material 122 can prevent the substrate G from moving off from the space between the upper surface cooling plate 111 and the lower surface cooling plate 112.

By cooling the substrate G from both surfaces as described above by the upper surface cooling plate 111 and the lower surface cooling plate 112, the substrate G can be uniformly cooled and can be also efficiently cooled in a short time. It should be noted that if the cooling plate is brought close only to one surface of the substrate G to cool the substrate G only from the one surface, there will occur a temperature difference between the surface on the side to be cooled and the surface on the opposite side, which difference may present a concern that the thermal stress causes the substrate G to get warped. In contrast, evenly cooling the substrate G from both the surfaces can prevent occurrence of the temperature difference in the substrate G to prevent warpage of the substrate G.

After the cooling of the substrate G is finished and the load lock chamber 102 is brought into an almost atmospheric pressure state, the carry-out port 104 is opened by opening the gate valve 28 with the carry-in port 103 kept closed by the gate valve 27. Even during the carry-out port 104 kept open, the vacuum state in the carrier room 33 can be maintained by keeping the carry-in port 103 closed by the gate valve 27. The upper surface cooling plate 111 is returned to the waiting position P3. Further, the carrier arm 15 of the carrier unit 12 enters the load lock chamber 102 via the carry-out port 104, so that the carrier arm 15 then receives the substrate G from the holding members 110, and the carrier arm 15 holding the substrate G retracts from the load lock chamber 102. Thus, the substrate G is carried out of the load lock chamber 102 via the carry-out port 104 into the carry-in/out section 2, and then returned by the carrier arm 15 to the cassette C on the mounting table 11. In the above manner, a series of processing processes in the processing system 1 is finished.

According to the processing system 1, the plate body 75 of the upper surface heating plate 71 is made of a porous material, thereby making it possible for the heating gas to pass through the pores in the plate body 75. It is possible to cause the heating gas to blow out uniformly from the surface of the plate body 75 so that the heating gas is sprayed evenly to the entire surface of the substrate G. Therefore, the heating gas can efficiently and uniformly heat the substrate G to preferably control the temperature of the substrate G. Uniformly pre-heating the substrate G can prevent warpage deformation of the substrate G and prevent uneven processing in the substrate processing apparatuses 30A to 30E. The use of the lightweight porous material for the upper surface heating plate 71 can reduce the weight of the apparatus.

Further, the plate body 115 of the upper surface cooling plate 111 is made of a porous material, thereby making it possible for the cooling gas to pass through the pores in the plate body 115. It is possible to cause the cooling gas to blow out uniformly from the surface of the plate body 115 so that the cooling gas is sprayed evenly to the entire surface of the substrate G. Therefore, the heating gas can efficiently and uniformly cool the substrate G to preferably control the temperature of the substrate G. Uniformly cooling the substrate G can prevent warpage deformation of the substrate G. The use of the lightweight porous material for the upper surface cooling plate 111 can reduce the weight of the apparatus.

A preferred embodiment of the present invention has been described above, but the present invention is not limited to the embodiment. It should be understood that various changes and modifications are readily apparent to those skilled in the art within the scope of the technical spirit as set forth in claims, and those should also be covered by the technical scope of the present invention.

Although one load lock apparatus 21 for heating is provided in the above-described embodiment, two or more load lock apparatuses 21 may be provided. Further, although one load lock apparatus 22 for cooling is provided, two or more load lock apparatuses 22 may be provided. Further, the load lock apparatus 21 for heating and the load lock apparatuses 22 for cooling are not limited to those stacked one on the other, but they may be laterally arranged, for example, side by side, or may be provided at positions away from each other.

Figure 6:
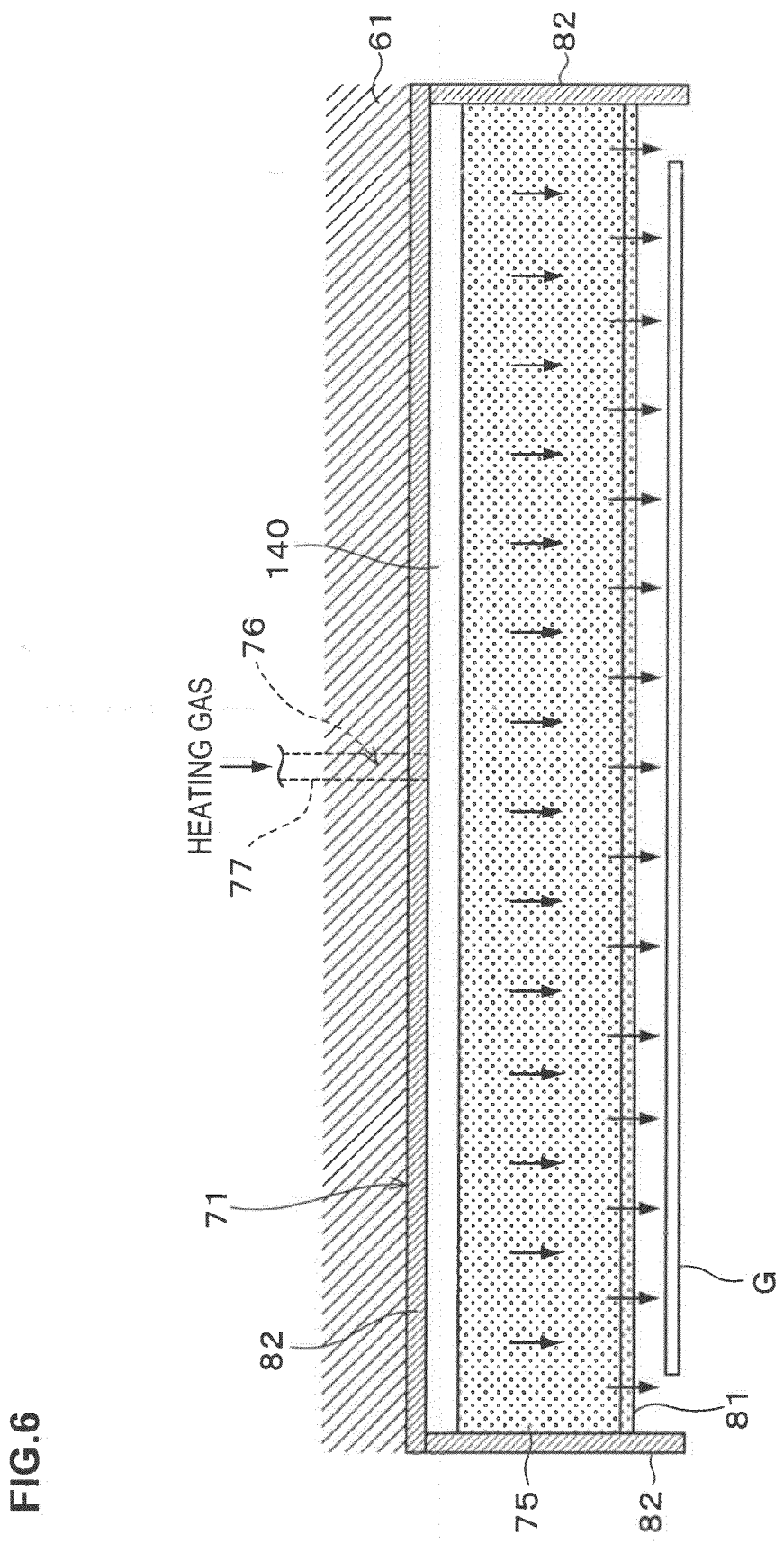
FIG. 6 is a longitudinal sectional view of an upper surface heating plate according to another embodiment.

Although in the load lock apparatus 21 illustrated in the embodiment, the upper surface heating plate 71 is configured such that the heating gas is supplied from the supply pipe 77 to the gap 75c provided inside the plate body 75, the form of the heating gas supply path 76 is not limited to that configuration. For example, a gap 140 may be provided between the upper surface of the plate body 75 and the non-permeable protection material 82 as shown in FIG. 6, so that the heating gas may be supplied from the supply pipe 77 into the gap 140 to flow downward in the entire plate body 75.

Figure 7:
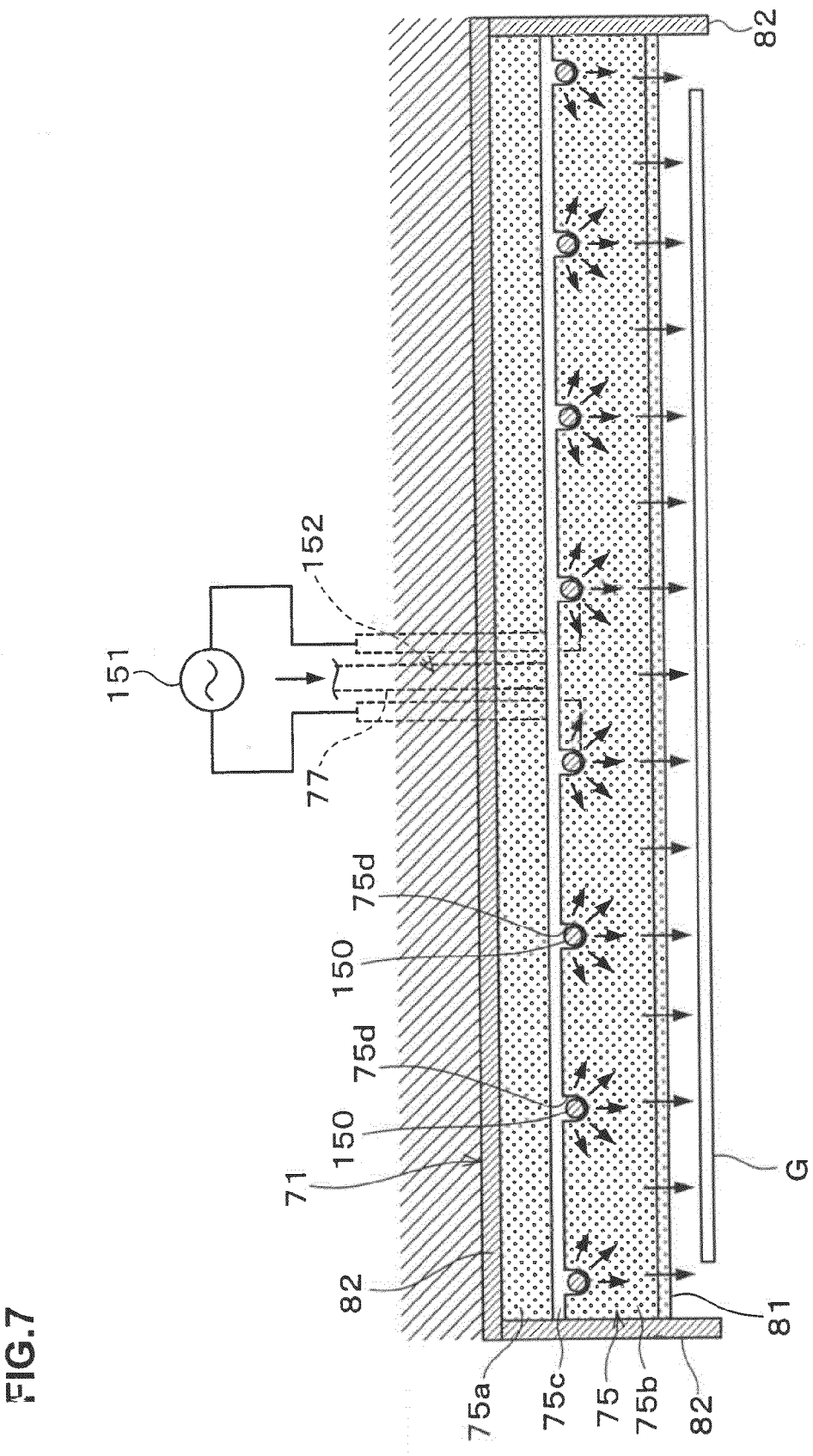
FIG. 7 is a longitudinal sectional view of an upper surface heating plate according to another embodiment.

Although the pre-heated heating gas is supplied to the upper surface heating plate 71 so that the plate body 75 and the substrate G are heated by the heating gas in the above embodiment, a heating element such as a sheathed heater or the like may be provided in the plate body 75 so that the plate body 75 and the gas passing through the plate body 75 can be heated by the heating element as shown in FIG. 7. In the example shown in FIG. 7, a heating element 150 is formed in a thin line and provided along and in the plurality of grooves 75d of the plate body 75. To the heating element 150, an alternating-current power supply 151 provided outside the chamber 61 is connected so that the electric power supplied from the alternating-current power supply 151 generates resistance heat. Further, from the supply pipe 77, for example, an inert gas such as $N_2$ (nitrogen) gas, He (helium) gas or the like is supplied. In other words, a gas supply path 152 is constituted of the supply pipe 77 and the gap 75c.

In the above configuration, the plate body 75 is heated by the heat transferred from the heating element 150. The gas supplied from the gas supply path 152, when flowing into the lower plate 75b of the plate body 75, is heated by the heating element 150, and is further heated by the heat of the plate body 75 during passage through the plate body 75. Thus, the gas heated by the heating element 150 and the plate body 75 blows out from the surface of the plate body 75 and is supplied to the front surface or the rear surface of the substrate G. Accordingly, even if the gas is not pre-heated, the gas can be sufficiently heated by the heating element 150 and the plate body 75, so that the sufficiently heated gas can be sprayed to the substrate G. Further, since the heat of the heating element 150 is conducted to the inside of the plate body 75 by the gas when the gas passes through the plate body 75, the flow of the gas accelerates the heating of the plate body 75. The gas uniformly flowing through the plate body 75 improves the uniformity in temperature distribution of the plate body 75. Accordingly, the lower surface of the plate body 75 can be efficiently and uniformly heated, whereby the radiation heat from the lower surface of the plate body 75 is uniformly emitted. Accordingly, the substrate G can be efficiently and uniformly heated.

Although the lower surface heating plate 72 is configured such that it can be raised and lowered and receives the substrate G from the holding members 70 through use of the supporting members 93 on the lower surface heating plate 72 in the above embodiment, the lower surface heating plate 72 may be configured not to receive the substrate G but to be only brought close to the substrate G supported on the holding members 70 (in this case, serving as the supporting members for supporting the substrate at time of heating). Further, the upper surface heating plate 71 may be configured such that it can be raised and lowered, so that movement of raising and lowering of the upper surface heating plate 71 itself can bring the upper surface heating plate 71 close to and away from the substrate G. The upper surface heating plate 71 employs the porous material and is thus lightweight so that it can be easily raised and lowered by a small driving force. Further, although the upper surface heating plate 71 and the lower surface heating plate 72 are configured to heat the substrate G with the plates 71 and 72 kept close to the substrate G with clearances intervening between the plates 71 and 72 and the substrate G respectively in the above-described embodiment, the upper surface heating plate 71 and the lower surface heating plate 72 may heat the substrate G with the plate 71 or 72 keeping in touch with the substrate G.

Although the upper surface heating plate 71 has the plate body 75 made of a porous material and a configuration to blow the heating gas in the above embodiment, the lower surface heating plate 72, in place of the upper surface heating plate 71, may have a plate body made of a porous material and a configuration to blow the heating gas. This allows the heating gas to be uniformly sprayed to the rear surface of the substrate G to heat efficiently and uniformly the rear surface of the substrate G. Further, both of the upper surface heating plate 71 and the lower surface heating plate 72 may have a plate body made of a porous material and a configuration to blow the heating gas.

Figure 8:
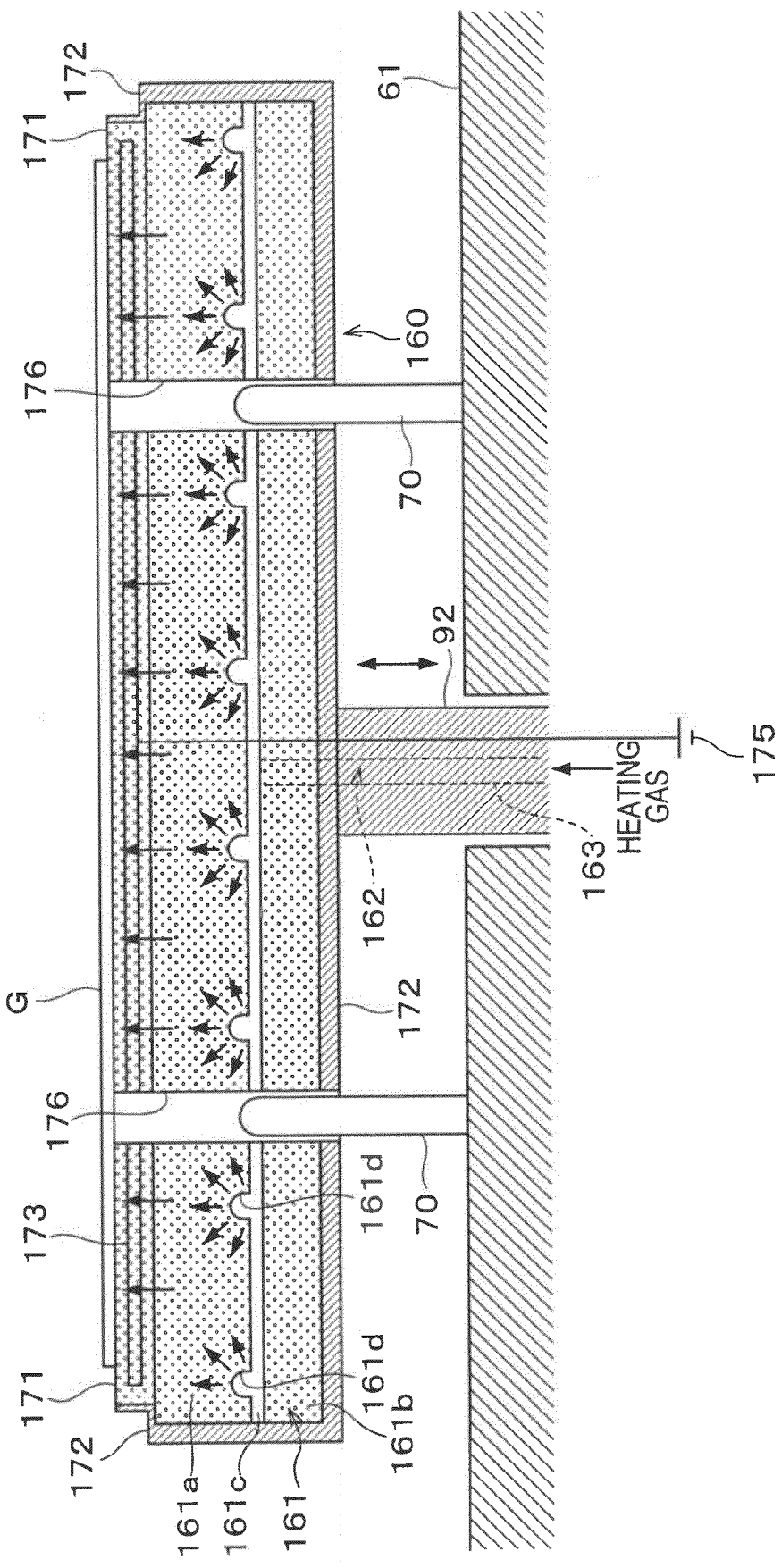
FIG. 8 is a longitudinal sectional view of a lower surface heating plate according to another embodiment.

Furthermore, an electrostatic attraction electrode may be provided on the surface of the upper surface heating plate 71 or the lower surface heating plate 72 to electrostatically attract the substrate G. FIG. 8 shows an example where the lower surface heating plate having a configuration to blow the heating gas includes an electrostatic attraction electrode. In FIG. 8, a lower surface heating plate 160 comprises a permeable plate body 161 made of a porous material and a heating gas supply path 162 for supplying the heating gas to the plate body 161. The plate body 161 is configured, similarly to the plate body 75, such that a gap 161c with a substantially uniform width and extending in a substantially horizontal direction is formed between an upper plate 161a and a lower plate 161b. The lower surface of the upper plate 161a is provided with a plurality of grooves 161d which are recessed upward in a hollow shape. The heating gas supply path 162 is constituted of the internal flow passage of a supply pipe 163 connected to the gap 161c, the gap 161c, and the grooves 161d. The upper surface of the plate body 161 is formed with a permeable protection film 171, and the lower surface and the outer side surface of the plate body 161 are covered with a non-permeable protection material 172. Further, the permeable protection film 171 incorporates an electrostatic attraction electrode 173 made of a conductor in a thin layer shape. The electrostatic attraction electrode 173 is permeable and is entirely covered with the permeable protection film 171 for protection. As the material of the permeable protection film 171 in this case, an insulating material is used, for example, ceramics such as alumina and the like. The electrostatic attraction electrode 173 is also connected to a direct-current power supply 175 provided outside the chamber 61. Note that the electrostatic attraction electrode 173 may also be formed by thermal spraying. For example, thermal spraying can be performed onto the surface of the plate body 161 in the order of the permeable protection film 171, the electrostatic attraction electrode 173, and the permeable protection film 171 into a layered form. The holding members 70 are respectively arranged within a plurality of holes 176 formed in the lower surface heating plate 160 in a manner to vertically penetrate it, so that the lower surface heating plate 160 can be raised and lowered with the holes 176 moving along the respective holding members 70.

In this configuration, the substrate G is attracted to the surface of the permeable protection film 171 by an electrostatic force generated on the surface of the permeable protection film 171 on the upper surface of the lower surface heating plate 160. Accordingly, the substrate G is surely held in a state in which the substrate G is in close contact with the lower surface heating plate 160. Note that at the time of receiving the substrate G, the lower surface heating plate 160 is first lowered to the waiting position, the lower surface heating plate 160 is raised after the substrate G is passed onto the holding members 70 so that the lower surface heating plate 160 lifts the substrate G from the holding members 70 and electrostatically attracts the substrate G. On the other hand, the heating gas is supplied to the entire lower surface of the electrostatically attracted substrate G after passing through the plate body 161, the permeable protection film 171, the electrostatic attraction electrode 173, and the permeable protection film 171 in order. This can heat the substrate G efficiently and uniformly. Note that the lower surface heating plate 160 may be configured, similarly to the upper surface heating plate 71, such that a heating element is provided in the plate body 161 so that the plate body 161 and the gas passing through the plate body 161 can be heated by the heating element.

Figure 9:
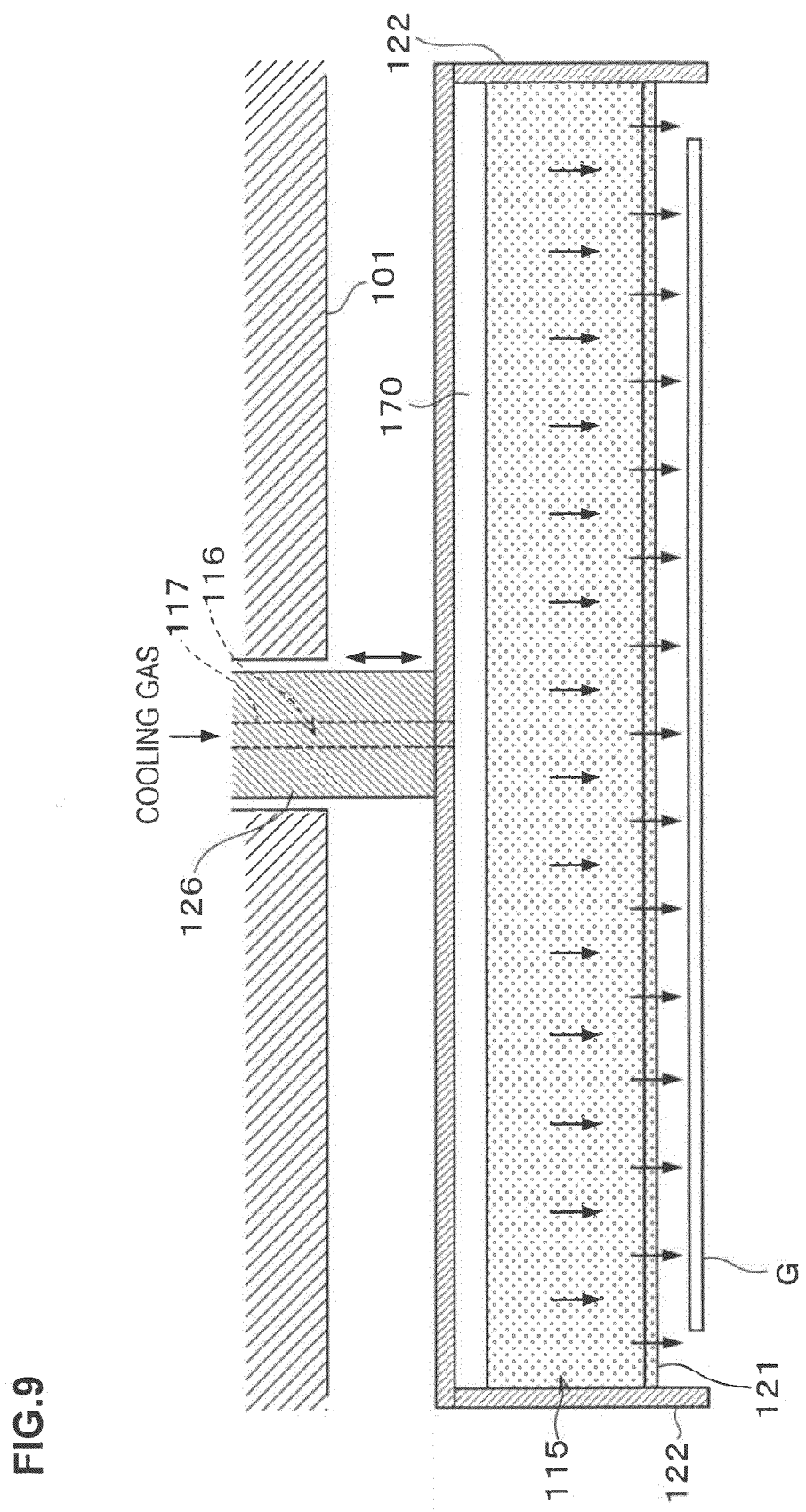
FIG. 9 is a longitudinal sectional view of an upper surface cooling plate according to another embodiment.

Besides, although the upper surface cooling plate 111 is configured such that the cooling gas is supplied into the gap 115c provided in the plate body 115 from the supply pipe 117 in the load lock apparatus 22 illustrated in the above embodiment, the cooling gas supply path 116 is not limited to that configuration. For example, a gap 170 may be provided between the upper surface of the plate body 115 and the non-permeable protection material 122 as shown in FIG. 9, so that the cooling gas may be supplied from the supply pipe 117 into the gap 170 to flow downward in the entire plate body 115.

Figure 10:
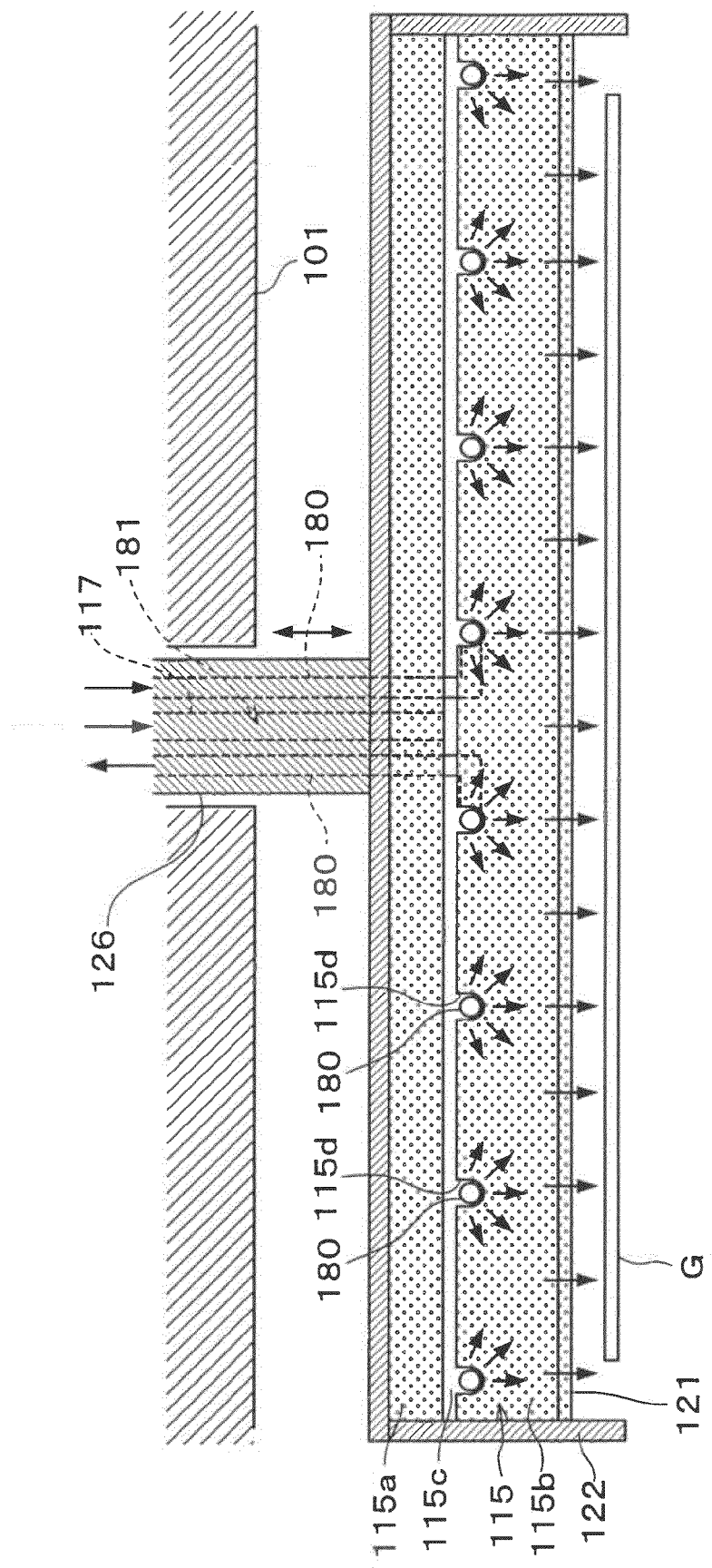
FIG. 10 is a longitudinal sectional view of an upper surface cooling plate according to another embodiment.

Although the pre-cooled cooling gas is supplied to the upper surface cooling plate 111 so that the plate body 115 and the substrate G are cooled by the cooling gas in the above embodiment, for example, a cooling water conveyance path for conveying a cooling water may be provided in the plate body 115 as shown in FIG. 10 so that the plate body 115 and the gas passing through the plate body 115 can be cooled by the cooling water conveyance pipe. In the example shown in FIG. 10, a cooling water conveyance pipe 180 is formed in the shape of a thin tube and provided along and in the plurality of grooves 115d of the plate body 115. Further, the cooling water conveyance pipe 180 is connected to a not-shown cooling water supply source provided outside the chamber 101. On the other hand, an inert gas such as $N_2$ gas, He gas or the like is supplied from the supply pipe 117. In other words, a gas supply path 181 is constituted of the supply pipe 117 and the gap 115c.

In the above configuration, the plate body 115 is cooled by the cold heat of the cooling water passing through the cooling water conveyance pipe 180. The gas supplied from the gas supply path 181, when flowing into the lower plate 115b of the plate body 115, is cooled by the cooling water conveyance pipe 180, and further cooled by the cold heat of the plate body 115 during passage through the plate body 115. Thus, the gas cooled by the cooling water conveyance pipe 180 and the plate body 115 blows out from the surface of the plate body 115 and is supplied to the front surface or the rear surface of the substrate G. Accordingly, even if the gas is not pre-cooled, the gas can be sufficiently cooled by the cooling water conveyance pipe 180 and the plate body 115, so that the sufficiently cooled gas can be sprayed to the substrate G. Further, since the cold heat of the cooling water conveyance pipe 180 is conveyed into the entire plate body 115 by the gas when the gas passes through the plate body 115, the flow of the gas accelerates the cooling of the plate body 115. The gas uniformly flowing through the plate body 115 improves the uniformity in temperature distribution of the plate body 115. Accordingly, the lower surface of the plate body 115 is efficiently and uniformly cooled, whereby the cold heat is supplied from the lower surface of the plate body 115. Accordingly, the substrate G can be efficiently and uniformly cooled.

Although the upper surface cooling plate 111 is configured such that it can be raised and lowered with respect to the chamber 101 so as to be brought close to and away from the substrate G and the lower surface cooling pate 112 is secured to the chamber 101, the lower surface cooling pate 112 may be configured, as a matter of course, such that it can also be brought close to and away from the substrate G. Further, the lower surface cooling plate 112 may be configured such that supporting members for supporting the substrate G are provided on the upper surface of the lower surface cooling plate 112, for example, similarly to the lower surface heating plate 72 in the load lock apparatus 21, to receive the substrate G from the supporting members 110 at the time of cooling the substrate G. In this case, the upper surface cooling plate 111 and the lower surface cooling plate 112 can be configured such that they can be relatively brought close to and away from the substrate G housed between them respectively. Further, although the upper surface cooling plate 111 and the lower surface cooling plate 112 are configured to cool the substrate G with the plates 111 and 112 kept close to the substrate G with clearances intervening between the plates 111 and 112 and the substrate G respectively in the above embodiment, the upper surface cooling plate 111 and the lower surface cooling plate 112 may cool the substrate G with the plates 111 and 112 keeping in touch with the substrate G.

Although the upper surface cooling plate 111 has the plate body 115 made of a porous material and a configuration to blow the cooling gas in the above embodiment, the lower surface cooling plate 112, in place of the upper surface cooling plate 111, may have a plate body made of a porous material and a configuration to blow the cooling gas. This allows the cooling gas to be uniformly sprayed to the rear surface of the substrate G to cool efficiently and uniformly the rear surface of the substrate G. Further, both of the upper surface cooling plate 111 and the lower surface cooling plate 112 may have a plate body made of a porous material and a configuration to blow the cooling gas.

Furthermore, an electrostatic attraction electrode may be provided on the surface of the upper surface cooling plate 111 or the lower surface cooling plate 112 to electrostatically attract the substrate G. FIG. 11 shows an example where the lower surface cooling plate having a configuration to blow the cooling gas includes an electrostatic attraction electrode. In FIG. 11, a lower surface cooling plate 190 comprises a permeable plate body 191 made of a porous material and a cooling gas supply path 192 for supplying the cooling gas to the plate body 191. The plate body 191 is configured, similarly to the plate body 115, such that a gap 191c with a substantially uniform width and extending in a substantially horizontal direction is formed between an upper plate 191a and a lower plate 191b. The lower surface of the upper plate 191a is provided with a plurality of grooves 191d which are recessed upward in a hollow shape. The cooling gas supply path 192 is constituted of the internal space of a supply pipe 193 connected to the gap 191c, the gap 191c, and the grooves 191d. The upper surface of the plate body 191 is formed with a permeable protection film 201, and the lower surface and the outer side surface of the plate body 191 are covered with a non-permeable protection material 202. Further, the permeable protection film 201 incorporates an electrostatic attraction electrode 203 made of a conductor in a thin layer shape. The electrostatic attraction electrode 203 is permeable and is entirely covered with the permeable protection film 201 for protection. As the material of the permeable protection film 201 in this case, an insulating material is used, for example, ceramics such as alumina and the like. The electrostatic attraction electrode 203 is also connected to a direct-current power supply 205 provided outside the chamber 101. Note that the electrostatic attraction electrode 203 may also be formed by thermal spraying. For example, thermal spraying can be performed onto the surface of the plate body 191 in the order of the permeable protection film 201, the electrostatic attraction electrode 203, and the permeable protection film 201 into a layered form. In this configuration, the substrate G is attracted to the surface of the permeable protection film 201 by an electrostatic force generated on the surface of the permeable protection film 201 on the upper surface of the lower surface cooling plate 190. Accordingly, the substrate G is surely held in a state in which the substrate G is in close contact with the lower surface cooling plate 190. Besides, the cooling gas is supplied to the entire lower surface of the substrate G after passing through the plate body 191, the permeable protection film 201, the electrostatic attraction electrode 203, and the permeable protection film 201 in order. This can cool the substrate G efficiently and uniformly. Note that the lower surface cooling plate 190 may be configured, similarly to the upper surface cooling plate 111 shown in FIG. 10, such that, for example, a cooling water conveyance pipe for conveying a cooling water is provided in the plate body 191 so that the plate body 191 and the gas passing through the plate body 191 can be cooled by the cooling water conveyance pipe.

The processing system is not limited to the multi-chamber type including a plurality of substrate processing apparatuses. Although the processing system 1 in which the plasma CVD processing is performed in the processing section 3 has been described in the above embodiment, the processing performed in the processing section may be other processing. The present invention is also applicable to a processing system performing, in the processing section, other processing performed in a reduced-pressure atmosphere, for example, thermal CVD processing, etching processing, ashing processing, and so on. Further, although the case in which the substrate G for LCD is processed has been described in the above embodiment, the substrate may be other one, for example, a semiconductor wafer or the like.

The invention claimed is:

1. A load lock apparatus including a carry port provided on a side of a carry-in/out section for carrying a substrate in/out from/to the outside, and a carry port provided on a side of a processing section for processing the substrate, said apparatus comprising:
   a temperature controlling plate for controlling a temperature of the substrate carried in said load lock apparatus; and
   a mechanism which brings the substrate and said temperature controlling plate relatively close to each other;
   said temperature controlling plate being placed on a front surface side of the substrate,
   said temperature controlling plate comprising a plate body made of a porous material and a temperature controlling gas supply path for supplying a temperature controlling gas controlled in temperature to said plate body,
   wherein the temperature controlling gas passes through said plate body, blows out from a surface of said plate body, and is supplied to the substrate,
   wherein an upper surface and an outer side surface of said plate body of said temperature controlling plate are covered with a non-permeable protection material,
   wherein the non-permeable protection material extends to a point below a lower surface of said plate body,
   wherein the non-permeable protection material surrounds an outside of a peripheral portion of the substrate when the substrate is brought close to said temperature controlling plate, and
   wherein said plate body is divided into upper and lower plates, a gap is formed between the upper plate and the lower plate, and an upper surface of the lower plate is provided with a plurality of grooves.

2. The load lock apparatus as set forth in claim 1, wherein the surface of said plate body is provided with a permeable protection film.

3. The load lock apparatus as set forth in claim 1, wherein the porous material is a porous aluminum alloy or a porous nickel alloy.

4. The load lock apparatus as set forth in claim 1, wherein said temperature controlling plate is capable of being relatively brought close to or away from the substrate by raising and lowering movements thereof.

5. The load lock apparatus as set forth in claim 1, further comprising:
- a second temperature controlling plate for controlling the temperature of the substrate carried in said load lock apparatus,
- said second temperature controlling plate being placed on a rear surface side of the substrate, and
- said second temperature controlling plate comprising a plate body made of a porous material and a temperature controlling gas supply path for supplying a temperature controlling gas controlled in temperature to said plate body.

6. The load lock apparatus as set forth in claim 5, wherein the porous material of said plate body of said temperature controlling plate and the porous material of said plate body of said second temperature controlling plate are a porous aluminum alloy or a porous nickel alloy.

7. The load lock apparatus as set forth in claim 5, wherein each of the surface of said plate body of said temperature controlling plate and a surface of said plate body of said second temperature controlling plate is provided with a permeable protection film.

8. The load lock apparatus as set forth in claim 5, wherein said temperature controlling plate and/or said second temperature controlling plate are/is capable of being relatively brought close to or away from the substrate by raising and lowering movements thereof.

9. The load lock apparatus as set forth in claim 5, wherein said second temperature controlling plate is provided with an electrostatic attraction electrode for electrostatically attracting the substrate.

10. A load lock apparatus including a carry port provided on a side of a carry-in/out section for carrying a substrate in/out from/to the outside, and a carry port provided on a side of a processing section for processing the substrate, said apparatus comprising:
- a temperature controlling plate for controlling a temperature of the substrate carried in said load lock apparatus; and
- a mechanism which brings the substrate and said temperature controlling plate relatively close to each other;
- said temperature controlling plate being placed on a front surface side of the substrate,
- said temperature controlling plate comprising a plate body made of a porous material, a temperature controller provided in said plate body, and a gas supply path for supplying a gas to said plate body,
- wherein the gas is controlled in temperature when passing through said plate body temperature-controlled by said temperature controller, blows out from a surface of said plate body, and is supplied to the substrate,
- wherein an upper surface and an outer side surface of said plate body of said temperature controlling plate are covered with a non-permeable protection material,
- wherein the non-permeable protection material extends to a point below a lower surface of said plate body,
- wherein the non-permeable protection material surrounds an outside of a peripheral portion of the substrate when the substrate is brought close to said temperature controlling plate, and
- wherein said plate body is divided into upper and lower plates, a gap is formed between the upper plate and the lower plate, and an upper surface of the lower plate is provided with a plurality of grooves.

11. The load lock apparatus as set forth in claim 10, wherein the surface of said plate body is provided with a permeable protection film.

12. The load lock apparatus as set forth in claim 10, wherein the porous material is a porous aluminum alloy or a porous nickel alloy.

13. The load lock apparatus as set forth in claim 10, wherein said temperature controlling plate is capable of being relatively brought close to or away from the substrate by raising and lowering movements thereof.

14. The load lock apparatus as set forth in claim 10, further comprising:
- a second temperature controlling plate for controlling the temperature of the substrate carried in said load lock apparatus,
- said second temperature controlling plate being placed on a rear surface side of the substrate, and
- said second temperature controlling plate comprising a plate body made of a porous material, a temperature controller provided in said plate body, and a gas supply path for supplying a gas to said plate body.

15. The load lock apparatus as set forth in claim 14, wherein the porous material of said plate body of said temperature controlling plate and the porous material of said plate body of said second temperature controlling plate are a porous aluminum alloy or a porous nickel alloy.

16. The load lock apparatus as set forth in claim 14, wherein each of the surface of said plate body of said temperature controlling plate and a surface of said plate body of said second temperature controlling plate is provided with a permeable protection film.

17. The load lock apparatus as set forth in claim 14, wherein said temperature controlling plate and/or said second temperature controlling plate are/is capable of being relatively brought close to or away from the substrate by raising and lowering movements thereof.

18. The load lock apparatus as set forth in claim 14, wherein said second temperature controlling plate is provided with an electrostatic attraction electrode for electrostatically attracting the substrate.

* * * * *